US012245396B2

(12) United States Patent
Sathyamurthy et al.

(10) Patent No.: US 12,245,396 B2
(45) Date of Patent: *Mar. 4, 2025

(54) INTEGRATION OF ACTIVE MEMS COOLING SYSTEMS INTO THIN COMPUTING DEVICES

(71) Applicant: Frore Systems Inc., San Jose, CA (US)

(72) Inventors: Prabhu Sathyamurthy, San Jose, CA (US); Suryaprakash Ganti, Los Altos, CA (US); Seshagiri Rao Madhavapeddy, La Jolla, CA (US); Nilesh Sudhir Hasabnis, Fremont, CA (US); Vikram Mukundan, San Ramon, CA (US); William Finn Ninian Paisley, Los Altos Hills, CA (US)

(73) Assignee: Frore Systems Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/523,790

(22) Filed: Nov. 29, 2023

(65) Prior Publication Data

US 2024/0179868 A1 May 30, 2024

Related U.S. Application Data

(60) Provisional application No. 63/547,653, filed on Nov. 7, 2023, provisional application No. 63/429,133, filed on Nov. 30, 2022.

(51) Int. Cl.
*H05K 7/20* (2006.01)
*G06F 1/20* (2006.01)

(52) U.S. Cl.
CPC .......... *H05K 7/20172* (2013.01); *G06F 1/20* (2013.01); *H05K 7/20145* (2013.01); *H05K 7/20154* (2013.01); *H05K 7/20436* (2013.01)

(58) Field of Classification Search
CPC .. G06F 1/20; H05K 7/20172; H05K 7/20145; H05K 7/20154; H05K 7/20436
(Continued)

(56) References Cited

U.S. PATENT DOCUMENTS 8,347,952 B2    1/2013   Ali
8,687,356 B2 *  4/2014   Merrow ............... H05K 7/20
                                              361/679.48
(Continued)

FOREIGN PATENT DOCUMENTS

JP    2018085510    5/2018

OTHER PUBLICATIONS

Fukue et al., Effect of Obstruction in front of a Piezoelectric Micro Blower on Performance Characteristics, 3rd IEEE CPMT Symposium Japan, (2013) (Dated retrieved: Feb. 27, 2024) [Retrieved from the internet: https://doi.org/10.1109/icsj.2013.6756109, 1-4.

(Continued)

*Primary Examiner* — Joel M Attey
(74) *Attorney, Agent, or Firm* — Van Pelt, Yi & James LLP

(57) ABSTRACT

A cooling system for a computing device is described. The cooling system includes a heat transfer structure. The heat transfer structure includes a heat spreader, a fin structure, and a differential pressure device. The fin structure transfers heat from the heat spreader to a fluid. The differential pressure device generates a low pressure region that draws the fluid from an ingress in the computing device through the fin structure. The heat transfer structure is enclosed in a chamber of the computing device. The chamber includes the ingress and an egress.

21 Claims, 16 Drawing Sheets

(58) Field of Classification Search
USPC .......................................... 165/80.3, 104.33
See application file for complete search history.

(56) References Cited

U.S. PATENT DOCUMENTS

| | | |
|---|---|---|
| 2009/0232683 A1 | 9/2009 | Hirata |
| 2011/0292560 A1* | 12/2011 | Jewell-Larsen .... H05K 7/20172 |
| | | 361/231 |
| 2020/0049386 A1 | 2/2020 | Ganti |
| 2021/0183739 A1* | 6/2021 | Sathyamurthy ......... H01L 23/46 |
| 2023/0337406 A1* | 10/2023 | Bawa ................... H05K 7/2099 |

OTHER PUBLICATIONS

Kimber et al., Pressure and Flow Rate Performance of Piezoelectric Fans, IEEE Transactions on Components and Packaging Technologies 23(4), conference date Dec. 2009, publication date: Mar. 24, 2009, [Date retrieved: 3Z3/2024] Retrieved off the internet: https://doi.org/10.1109/tcapt.2008.2012169, p. 766-775.

Singh et al., Low Profile Cooling Solutions for Advanced Packaging Based on Ultra-Thin Heat Pipe and Piezo Fan, 3rd IEEE CPMT Symposium Japan, Nov. 11-13, 2013. [Date Retrieved: Mar. 3, 2024] Retrieved from the internet: https:ZZdoi.orgZ10.1109/icsj.2013.6756110, 1-4.

* cited by examiner

1000 the invention and is not intended to be limiting. -->

INTEGRATION OF ACTIVE MEMS COOLING SYSTEMS INTO THIN COMPUTING DEVICES

CROSS REFERENCE TO OTHER APPLICATIONS

This application claims priority to U.S. Provisional Patent Application No. 63/429,133 entitled INTEGRATION OF PIEZOELECTRIC COOLING SYSTEMS INTO THIN COMPUTING DEVICES filed Nov. 30, 2022 and U.S. Provisional Patent Application No. 63/547,653 entitled MEMS COOLING SYSTEM FOR THIN ELECTRONIC DEVICES filed Nov. 7, 2023, both of which are incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Moreover, incorporating cooling solutions into computing devices may be challenging. Consequently, additional cooling solutions for computing devices are desired.

BRIEF DESCRIPTION OF THE DRAWINGS

Various embodiments of the invention are disclosed in the following detailed description and the accompanying drawings.

DETAILED DESCRIPTION

Figure 1A:
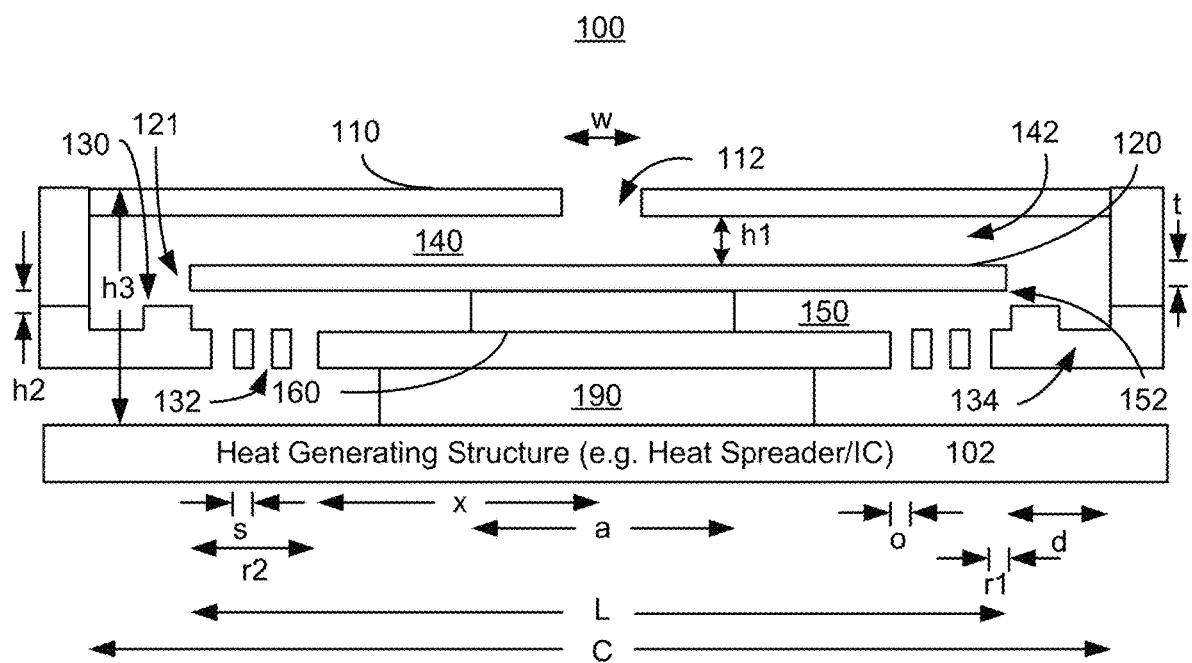
FIGS. 1A-1G depict an embodiment of an active MEMS cooling system including a centrally anchored cooling element.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebook computers, and virtual reality devices as well as for other computing devices such as servers, can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated. Further, other components in a computing device may generate heat. Thus, thermal management is increasingly an issue for computing devices.

Larger computing devices, such as laptop computers, desktop computers, or servers, include active cooling systems. Active cooling systems are those in which an electrical signal is used to drive cooling. An electric fan that has rotating blades is an example of an active cooling system, while a heat spreader is an example of a passive cooling system. When energized, the fan's rotating blades drive air through the larger devices to cool internal components. However, space and other limitations in computing devices limit the use of active cooling systems. Fans are typically too large for mobile and/or thinner devices such as smartphones and tablet or notebook computers. Fans also may have limited efficacy because of the boundary layer of air existing at the surface of the components because they provide a limited airspeed for air flow across the hot surface desired to be cooled, and because they may generate an excessive amount of noise. Fans also have a limited backpressure. Space and power limitations may further restrict the ability to provide electrical connection to active cooling systems. For example, if multiple active cooling systems are used, the connections to the active cooling systems may be required to fit within a small area. In addition, the power consumed by such a cooling system may be desired to be small, particularly for mobile devices. Moreover, space limitations may adversely affect the ability to provide a sufficient flow for cooling computing devices. Consequently, active cooling systems face particular challenges when used in computing devices such as active computing devices. Passive cooling solutions may include components such as a heat spreader and a heat pipe or vapor chamber to transfer heat to a heat exchanger. However, passive cooling solutions may be unable to provide a sufficient amount of heat transfer to remove excessive heat generated. Thus, additional cooling solutions are desired.

A cooling system for a computing device is described. The cooling system includes a heat transfer structure. The heat transfer structure includes a heat spreader, a fin structure, and a differential pressure device. The fin structure transfers heat from the heat spreader to a fluid. The differential pressure device generates a low pressure region that draws the fluid from an ingress in the computing device through the fin structure. The heat transfer structure is enclosed in a chamber of the computing device. The chamber includes the ingress and an egress.

In some embodiments, the heat transfer structure restricts flow driven by the differential pressure device such that a pressure differential of at least a one hundred Pascals per cubic feet per minute (cfm) (100 Pa/cfm) is within the chamber. In some such embodiments, the pressure differential is at least four hundred pascals per cfm (400 Pa/cfm). The pressure differential may be at least five hundred pascals per cfm (500 Pa/cfm).

In some embodiments, the differential pressure device generates the low pressure region that draws the fluid from the ingress such that greater than 2 W of heat is ejected from the egress. In some embodiments, at least 6 W of heat is ejected from the egress.

The differential pressure device may include cells, a top cover, and a bottom plate. Each of the cells includes a flow chamber having a vent, an actuator, and a plurality of orifices. Vibrational motion of the actuator draws the fluid into the flow chamber via the vent, directs the fluid around the actuator, and drives the fluid out of the flow chamber through the orifices. The top cover is proximate to the vent and has aperture(s) therein. The bottom plate is proximate to the orifices and coupled with the top cover. The fluid is directed from the orifices toward the bottom plate. In some embodiments, the fluid flows through the differential pressure device and to the egress. A top gap of at least 0.3 mm and not more than 1 mm may be is between the top cover of the differential pressure device and the top of the chamber. The differential pressure device may have a height not exceeding 3.5 millimeters.

A cooling system for a computing device is described. The cooling system includes a heat transfer structure including a heat spreader and a differential pressure device. The differential pressure device generates a low pressure region that draws fluid from an ingress in the computing device through the heat transfer structure. The differential pressure device has a height not exceeding 3.5 millimeters. In some embodiments, the height of the differential pressure device does not exceed 3 millimeters. In some embodiments, the heat transfer structure resides in a chamber of the computing device having a chamber height of at least 2 millimeters and not more than 3.5 millimeters. In some embodiments, the heat transfer structure is enclosed in a chamber of the computing device. The chamber has the ingress and an egress. In such embodiments, the heat transfer structure further includes a fin structure that transfers heat from the heat spreader to the fluid. The low pressure region generated by the differential pressure device draws the fluid through the fin structure. In some embodiments, the heat transfer structure restricts flow driven by the differential pressure device such that a pressure differential of at least a one hundred Pascals per cubic feet per minute (cfm) (100 Pa/cfm) is within the chamber. In some embodiments, the differential pressure device generates the low pressure region such that greater than 2 W of heat is ejected from an egress of the computing device.

The differential pressure device may include cells, a top cover, and a bottom plate. Each of the plurality of cells includes a flow chamber having a vent, an actuator, and orifices. Vibrational motion of the actuator draws the fluid into the flow chamber via the vent, directs the fluid around the actuator, and drives the fluid out of the flow chamber through the orifices. The top cover is proximate to the vent and has at least one aperture therein. The bottom plate is proximate to the orifices and coupled with the top cover. The fluid is directed from the orifices toward the bottom plate.

A method is described. The method includes activating an active component in a differential pressure device to undergo vibrational motion. A computing device includes a heat transfer structure. The heat transfer structure includes the differential pressure device, a fin structure, and a heat spreader. The fin structure transfers heat from the heat spreader to a fluid. The vibrational motion of the active component generates a low pressure region that draws the fluid from an ingress in the computing device through the fin structure. The heat transfer structure is enclosed in a chamber of the computing device. The chamber has the ingress and an egress. In some embodiments, the vibrational motion of the active component generates a low pressure region that draws fluid from an ingress in the computing device such that greater than 2 W of heat is ejected from the egress. In some embodiments, the differential pressure device has a height not exceeding 3.5 millimeters.

Figure 1B:
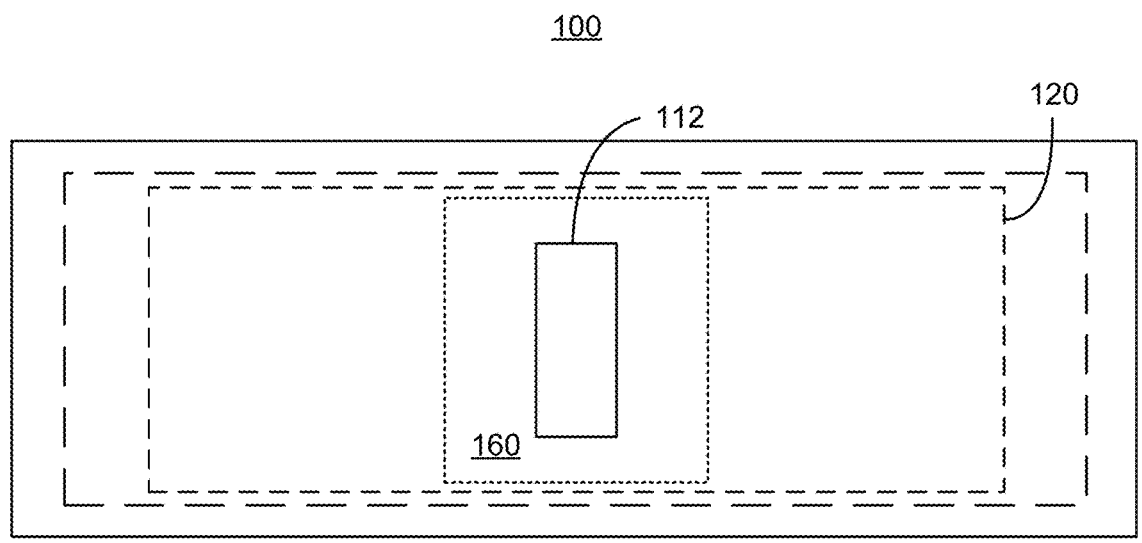
Figure 1C:
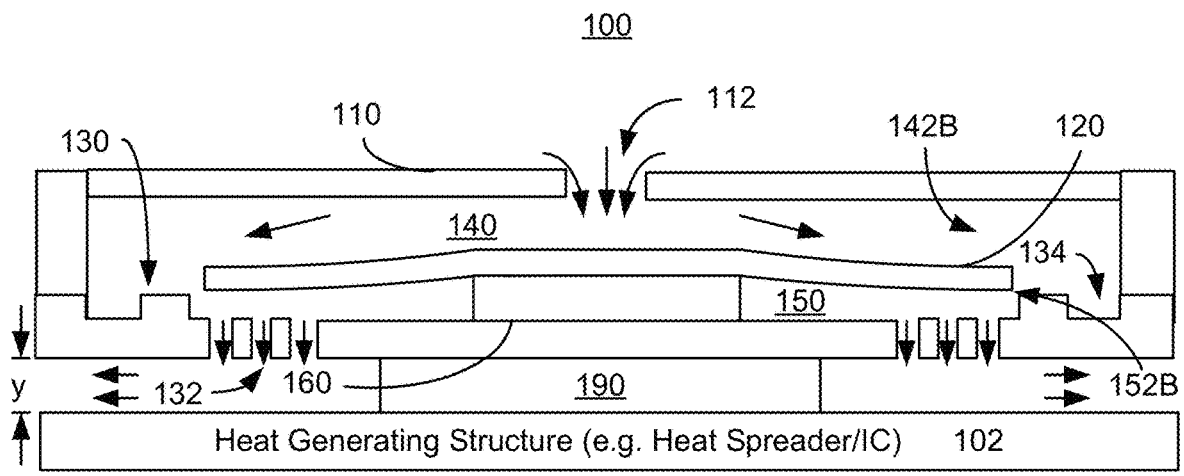
Figure 1D:
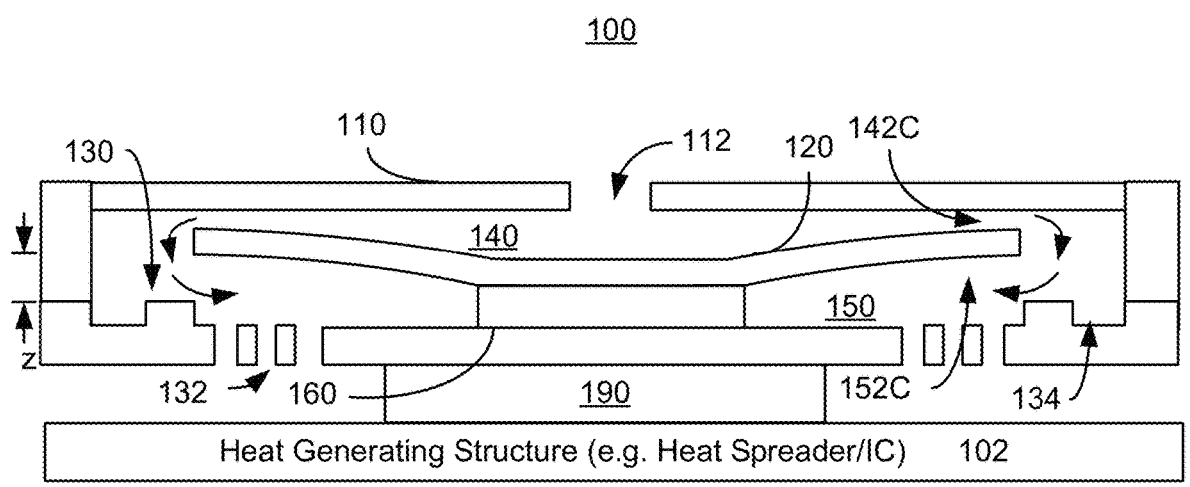
Figure 1E:
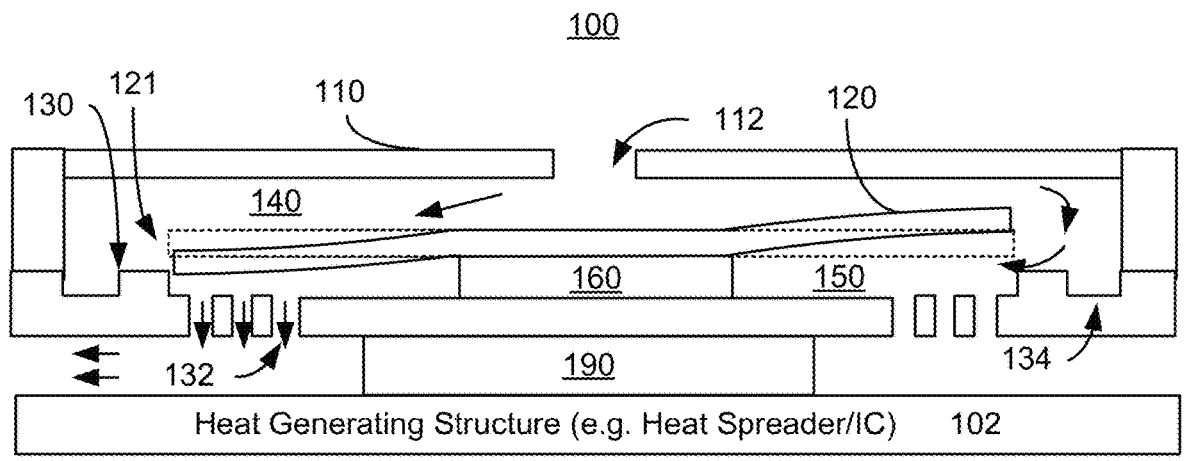
Figure 1F:
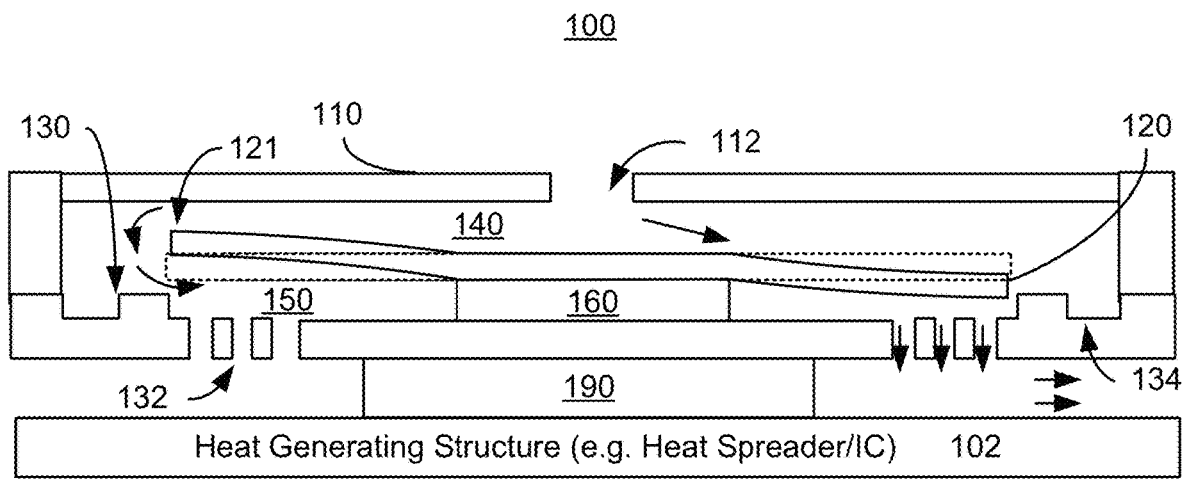
Figure 1G:
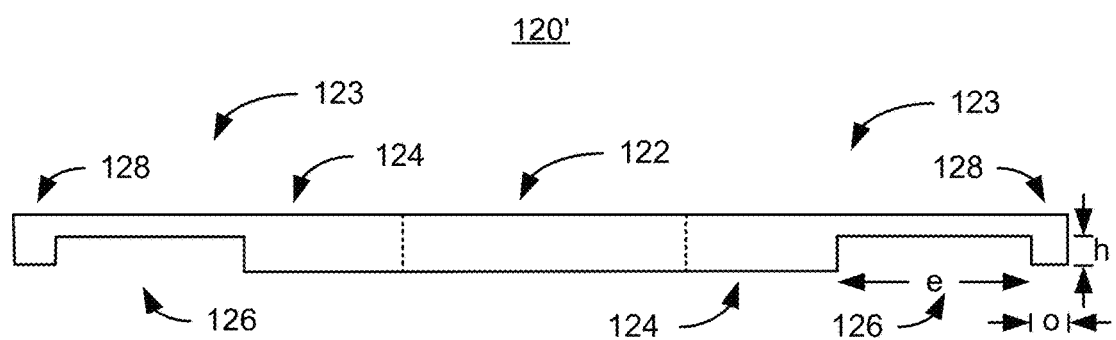

FIGS. 1A-1G are diagrams depicting an exemplary embodiment of active MEMS cooling system 100 usable with heat-generating structure 102 and including a centrally anchored cooling element 120 or 120'. Although termed a cooling system, MEMS system 100 and analogous systems described herein may be considered heat transfer systems and/or fluid transfer systems. Cooling element 120 is shown in FIGS. 1A-1F and cooling element 120' is shown in FIG. 1G. For clarity, only certain components are shown. FIGS. 1A-1G are not to scale. FIGS. 1A and 1B depict cross-sectional and top views of cooling system 100 in a neutral position. FIGS. 1C-1D depict cooling system 100 during actuation for in-phase vibrational motion. FIGS. 1E-IF depict cooling system 100 during actuation for out-of-phase vibrational motion. Although shown as symmetric, cooling system 100 need not be.

Cooling system 100 includes top plate 110 having vent 112 therein, cooling element 120, orifice plate 130 having orifices 132 and cavities 134 therein, support structure (or "anchor") 160 and chambers 140 and 150 (collectively chamber 140/150) formed therein. Cooling element 120 is supported at its central region by anchor 160. Although termed a cooling element with respect to FIGS. 1A-1G, cooling element 120 and analogous elements described herein may also be considered actuators, vibrating elements, vibrating components, active components, and/or other terms indicating that the element is configured to undergo vibrational motion when activated (or energized) and/or to drive fluid through a system. Regions of cooling element 120 closer to and including portions of the cooling element's perimeter (e.g. tip 121) vibrate when actuated. In some embodiments, tip 121 of cooling element 120 includes a portion of the perimeter furthest from anchor 160 and undergoes the largest deflection during actuation of cooling element 120. For clarity, only one tip 121 of cooling element 120 is labeled in FIG. 1A. Also shown is pedestal 190 that connects orifice plate 130 to and offsets orifice plate 130 from heat-generating structure 102. In some embodiments, pedestal 190 also thermally couples orifice plate 130 to heat-generating structure 102. In some embodiments, an additional jet channel plate may be present and supported by pedestal 190. Thus orifice plate 130 and/or such a jet channel plate may be part or all of a bottom plate supported by pedestal 190. Thus, multiple plates and/or plate(s) having various structures may be used at the bottom plate for cooling system 100.

FIG. 1A depicts cooling system 100 in a neutral position. Thus, cooling element 120 is shown as substantially flat. For in-phase operation, cooling element 120 is driven to vibrate between positions shown in FIGS. 1C and 1D. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled. In some embodiments, heat-generating structure 102 may be a thermally conductive part of a module containing cooling system 100. For example, cooling system 100 may be affixed to heat-generating structure 102, which may be coupled to another heat spreader, vapor chamber, integrated circuit, or other separate structure desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electro-mechanical system (MEMS) cooling system capable of residing within mobile computing devices and/or other devices having limited space in at least one dimension. For example, the total height, h3, of cooling system 100 (from the top of heat-generating structure 102 to the top of top plate 110) may be less than 2 millimeters. In some embodiments, the total height of cooling system 100 is not more than 1.5 millimeters. In some embodiments, this total height is not more than 1.1 millimeters. In some embodiments, the total height does not exceed one millimeter. In some embodiments, the total height does not exceed two hundred and fifty micrometers. Similarly, the distance between the bottom of orifice plate 130 and the top of heat-generating structure 102, y, may be small. In some embodiments, y is at least two hundred micrometers and not more than 1.2 millimeter. For example, y may be at least two hundred and fifty micrometers and not more than three hundred micrometers. In some embodiments, y is at least five hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system 100 resides (e.g. in an enclosed device).

Cooling element 120 can be considered to divide the interior of active MEMS cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1F). In such embodiments, portions of cooling element 120 that vibrate (e.g. including tip 121) move in a cantilevered fashion. Thus, portions of cooling element 120 may move in a manner analogous to the wings of a butterfly (i.e. in phase) and/or analogous to a seesaw (i.e. out of phase). Thus, the portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1F, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-1F. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130. Thus, cooling element 120 may be viewed as an actuator. Although described in the context of a single, continuous cooling element, in some embodiments, cooling element 120 may be formed by two (or more) cooling elements. Each of the cooling elements is depicted as one portion pinned (e.g. supported by support structure 160) and an opposite portion unpinned. Thus, a single, centrally supported cooling element 120 may be formed by a combination of multiple cooling elements supported at an edge.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1F) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C, of chamber 140/150 is close to the length, L, of cooling element 120. For example, in some embodiments, the distance, d, between the edge of cooling element 120 and the wall of chamber 140/150 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be a cantilevered section in some embodiments. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is C/2. Thus, $C/2=n\lambda/4$, where $\lambda$ is the acoustic wavelength for the fluid and n is odd (e.g. n=1, 3, 5, etc.). For the lowest order mode, $C=\lambda/2$. Because the length of chamber 140 (e.g. C) is close to the length of cooling element 120, in some embodiments, it is also approximately true that $L/2=n\lambda/4$, where $\lambda$ is the acoustic wavelength for the fluid and n is odd. Thus, the frequency at which cooling element 120 is driven, v, is at or near the structural resonant frequency for cooling element 120. The frequency v is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency rather than to the acoustic resonant frequency.

Orifice plate 130 has orifices 132 and cavities 134 therein. Although a particular number and distribution of orifices 132 and cavities 134 are shown, another number and/or another distribution may be used. Cavities 134 may be configured differently or may be omitted. In some embodiments, other cavities may be within flow chamber 140/150 or the jet channel between orifice plate 130 and heat-generating structure 102. For example, cavities may be included in top plate 110 within flow chamber 140/150 or in the bottom of orifice plate 130. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of cooling element 120 (tip 121 moves away from orifice plate 130) that would pull fluid into bottom chamber 150 through orifices 132 is reduced. The locations of orifices are also desired to be sufficiently close to tip 121 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of cooling element 120. In some embodiments, r1 is at least one hundred micrometers (e.g. r1≥100 μm) and r2 is not more than one millimeter (e.g. r2≤1000 μm). In some embodiments, orifices 132 are at least two hundred micrometers from tip 121 of cooling element 120 (e.g. r1≥200 μm). In some such embodiments, orifices 132 are at least three hundred micrometers from tip 121 of cooling element 120 (e.g. r1≥300 μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling elements though it is possible that a mechanism other than a piezoelectric might be used to drive the cooling element. In some embodiments, cooling element 120 includes a piezoelectric layer on substrate. The substrate may include or consist of stainless steel, a Ni alloy, Hastelloy, Al (e.g. an Al alloy), and/or Ti (e.g. a Ti alloy such as Ti6Al-4V). In some embodiments, a piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation, or other layers might be included in the piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Operation of cooling system 100 is described in the context of FIGS. 1A-1F. Although described in the context of particular pressures, gap sizes, and timing of flow, operation of cooling system 100 is not dependent upon the explanation herein. FIGS. 1C-1D depict in-phase operation of cooling system 100. Referring to FIG. 1C, cooling element 120 has been actuated so that its tip 121 moves away from top plate 110. FIG. 1C can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1C. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat-generating structure 102 is shown by unlabeled arrows in FIG. 1C.

Cooling element 120 is also actuated so that tip 121 moves away from heat-generating structure 102 and toward top plate 110. FIG. 1D can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1D. Thus, the fluid is driven from top chamber 140 (e.g. the periphery of chamber 140/150) to bottom chamber 150. Thus, when tip 121 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1D. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 150. Moreover, cooling system 100 may operate such that fluid is drawn in through vent 112 and driven out through orifices 132 without cooling element 120 contacting top plate 110 or orifice plate 130. Thus, pressures are developed within chambers 140 and 150 that effectively open and close vent 112 and orifices 132 such that fluid is driven through cooling system 100 as described herein.

The motion between the positions shown in FIGS. 1C and 1D is repeated. Thus, cooling element 120 undergoes vibrational motion indicated in FIGS. 1A-1D, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to the distal side of top plate 110 after cooling. In other embodiments, heated fluid is carried away and replaced by new fluid at the distal side of cooling element 120. As a result, heat-generating structure 102 may be cooled.

FIGS. 1E-1F depict an embodiment of active MEMS cooling system 100 including centrally anchored cooling element 120 in which the cooling element is driven out-of-phase. More specifically, sections of cooling element 120 on opposite sides of anchor 160 (and thus on opposite sides of the central region of cooling element 120 that is supported by anchor 160) are driven to vibrate out-of-phase. In some embodiments, sections of cooling element 120 on opposite sides of anchor 160 are driven at or near one hundred and eighty degrees out-of-phase. Thus, one section of cooling element 120 vibrates toward top plate 110, while the other section of cooling element 120 vibrates toward orifice plate 130/heat-generating structure 102. Movement of a section of cooling element 120 toward top plate 110 (an upstroke) drives fluid in top chamber 140 to bottom chamber 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. Because fluid is driven through orifices 132 at high speeds, cooling system 100 may be viewed as a MEMs jet. The movement of fluid is shown by unlabeled arrows in FIGS. 1E and 1F. The motion between the positions shown in FIGS. 1E and 1F is repeated. Thus, cooling element 120 undergoes vibrational motion indicated in FIGS. 1A, 1E, and 1F, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to the distal side of top plate 110 after cooling. In other embodiments, heated fluid is carried away and replaced by new fluid at the distal side of cooling element 120. As a result, heat-generating structure 102 may be cooled.

Although shown in the context of a uniform cooling element in FIGS. 1A-1F, cooling system 100 may utilize cooling elements having different shapes. FIG. 1G depicts an embodiment of engineered cooling element 120' having a tailored geometry and usable in a cooling system such as cooling system 100. Cooling element 120' includes an anchored region 122 and cantilevered arms 123. Anchored region 122 is supported (e.g. held in place) in cooling system 100 by anchor 160. Cantilevered arms 123 undergo vibrational motion in response to cooling element 120' being actuated. Each cantilevered arm 123 includes step region 124, extension region 126 and outer region 128. In the embodiment shown in FIG. 1G, anchored region 122 is centrally located. Step region 124 extends outward from anchored region 122. Extension region 126 extends outward from step region 124. Outer region 128 extends outward from extension region 126. In other embodiments, anchored region 122 may be at one edge of the actuator and outer region 128 at the opposing edge. In such embodiments, the actuator is edge anchored.

Extension region 126 has a thickness (extension thickness) that is less than the thickness of step region 124 (step thickness) and less than the thickness of outer region 128 (outer thickness). Thus, extension region 126 may be viewed as recessed. Extension region 126 may also be seen as providing a larger bottom chamber 150. In some embodiments, the outer thickness of outer region 128 is the same as the step thickness of step region 124. In some embodiments, the outer thickness of outer region 128 is different from the step thickness of step region 124. In some embodiments, outer region 128 and step region 124 each have a thickness of at least three hundred twenty micrometers and not more than three hundred and sixty micrometers. In some embodiments, the outer thickness is at least fifty micrometers and not more than two hundred micrometers thicker than the extension thickness. Stated differently, the step (difference in step thickness and extension thickness) is at least fifty micrometers and not more than two hundred micrometers. In some embodiments, the outer step (difference in outer thickness and extension thickness) is at least fifty micrometers and not more than two hundred micrometers. Outer region 128 may have a width, o, of at least one hundred micrometers and not more than three hundred micrometers. Extension region 126 has a length, e, extending outward from the step region of at least 0.5 millimeter and not more than 1.5 millimeters in some embodiments. In some embodiments, outer region 128 has a higher mass per unit length in the direction from anchored region 122 than extension region 126. This difference in mass may be due to the larger size of outer region 128, a difference in density between portions of cooling element 120, and/or another mechanism.

Use of engineered cooling element 120' may further improve efficiency of cooling system 100. Extension region 126 is thinner than step region 124 and outer region 128. This results in a cavity in the bottom of cooling element 120' corresponding to extension region 126. The presence of this cavity aids in improving the efficiency of cooling system 100. Each cantilevered arm 123 vibrates towards top plate 110 in an upstroke and away from top plate 110 in a downstroke. When a cantilevered arm 123 moves toward top plate 110, higher pressure fluid in top chamber 140 resists the motion of cantilevered arm 123. Furthermore, suction in bottom chamber 150 also resists the upward motion of cantilevered arm 123 during the upstroke. In the downstroke of cantilevered arm 123, increased pressure in the bottom chamber 150 and suction in top chamber 140 resist the downward motion of cantilevered arm 123. However, the presence of the cavity in cantilevered arm 123 corresponding to extension region 126 mitigates the suction in bottom chamber 150 during an upstroke. The cavity also reduces the increase in pressure in bottom chamber 150 during a downstroke. Because the suction and pressure increase are reduced in magnitude, cantilevered arms 123 may more readily move through the fluid. This may be achieved while substantially maintaining a higher pressure in top chamber 140, which drives the fluid flow through cooling system 100. Moreover, the presence of outer region 128 may improve the ability of cantilevered arm 123 to move through the fluid being driven through cooling system 100. Outer region 128 has a higher mass per unit length and thus a higher momentum. Consequently, outer region 128 may improve the ability of cantilevered arms 123 to move through the fluid being driven through cooling system 100. The magnitude of the deflection of cantilevered arm 123 may also be increased. These benefits may be achieved while maintaining the stiffness of cantilevered arms 123 through the use of thicker step region 124. Further, the larger thickness of outer region 128 may aid in pinching off flow at the bottom of a downstroke. Thus, the ability of cooling element 120' to provide a valve preventing backflow through orifices 132 may be improved. Thus, performance of cooling system 100 employing cooling element 120' may be improved.

Further, cooling elements used in cooling system 100 may have different structures and/or be mounted differently than depicted in FIGS. 1A-1G. In some embodiments, the cooling element may have rounded corners and/or rounded ends but still be anchored along a central axis such that cantilevered arms vibrate. The cooling element may be anchored only at its central region such that the regions surrounding the anchor vibrate in a manner analogous to a jellyfish or the opening/closing of an umbrella. In some such embodiments, the cooling element may be circular or elliptical in shape. In some embodiments, the anchor may include apertures through which fluid may flow. Such an anchor may be utilized for the cooling element being anchored at its top (e.g. to the top plate). Although not indicated in FIGS. 1A-1G, the piezoelectric utilized in driving the cooling element may have various locations and/or configurations. For example, the piezoelectric may be embedded in the cooling element, affixed to one side of the cooling element (or cantilevered arm(s)), may occupy some or all of the cantilevered arms, and/or may have a location that is close to or distal from the anchored region. In some embodiments, cooling elements that are not centrally anchored may be used. For example, a pair of cooling elements that have offset apertures, that are anchored at their ends (or all edges), and which vibrate out of phase may be used. Thus, various additional configurations of cooling element 120 and/or 120', anchor 160, and/or other portions of cooling system 100 may be used.

Using the cooling system 100 actuated for in-phase vibration or out-of-phase vibration of cooling element 120 and/or 120', fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120/120' may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120/120' does not physically contact top plate 110 or orifice plate 130 during vibration. Thus, resonance of cooling element 120/120' may be more readily maintained. More specifically, physical contact between cooling element 120/120' and other structures disturbs the resonance conditions for cooling element 120/120'. Disturbing these conditions may drive cooling element 120/120' out of resonance. Thus, additional power would need to be used to maintain actuation of cooling element 120/120'. Further, the flow of fluid driven by cooling element 120/120' may decrease. These issues are avoided through the use of pressure differentials and fluid flow as discussed above. The benefits of improved, quiet cooling may be achieved with limited additional power. Further, out-of-phase vibration of cooling element 120/120' allows the position of the center of mass of cooling element 120/120' to remain more stable. Although a torque is exerted on cooling element 120/120', the force due to the motion of the center of mass is reduced or eliminated. As a result, vibrations due to the motion of cooling element 120/120' may be reduced. Moreover, efficiency of cooling system 100 may be improved through the use of out-of-phase vibrational motion for the two sides of cooling element 120/120'. Consequently, performance of devices incorporating the cooling system 100 may be improved. Further, cooling system 100 may be usable in other applications (e.g. with or without heat-generating structure 102) in which high fluid flows and/or velocities are desired.

Figure 2A:
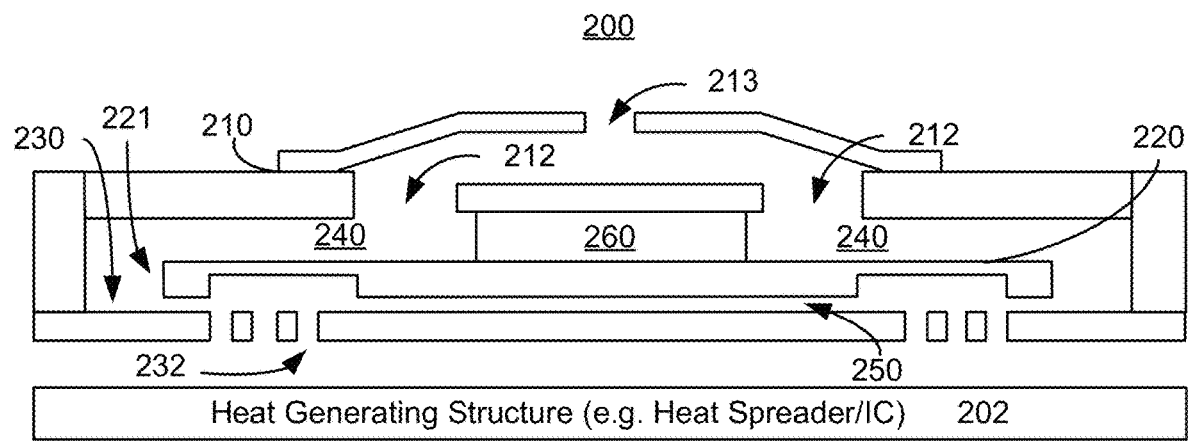
FIGS. 2A-2B depict an embodiment of an active MEMS cooling system including a centrally anchored cooling element.
Figure 2B:
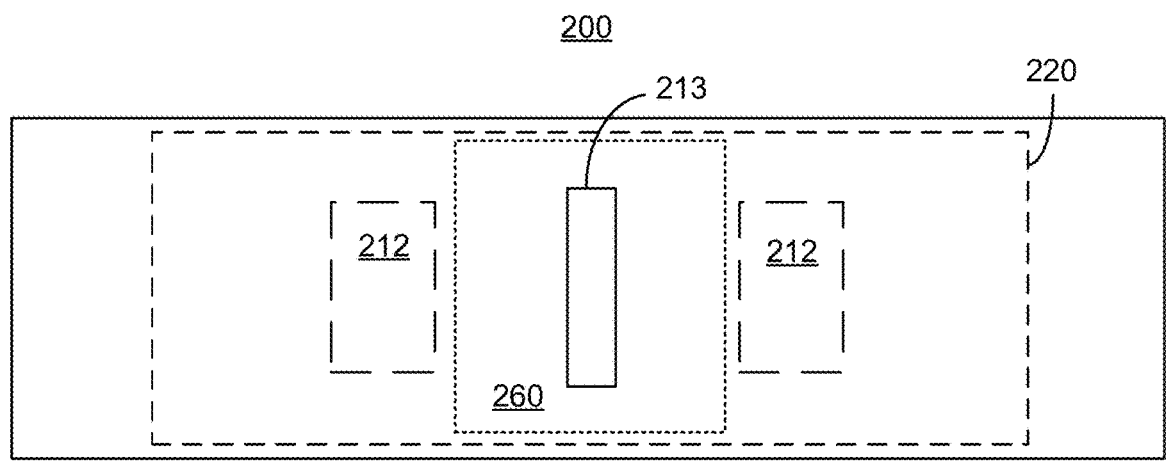

FIGS. 2A-2B depict an embodiment of active MEMS cooling system 200 including a top centrally anchored cooling element. FIG. 2A depicts a side view of cooling system 200 in a neutral position. FIG. 2B depicts a top view of cooling system 200. FIGS. 2A-2B are not to scale. For simplicity, only portions of cooling system 200 are shown. Referring to FIGS. 2A-2B, cooling system 200 is analogous to cooling system 100. Consequently, analogous components have similar labels. For example, cooling system 200 is used in conjunction with heat-generating structure 202, which is analogous to heat-generating structure 102.

Cooling system 200 includes top plate 210 having vents 212, cooling element 220 having tip 221, orifice plate 230 including orifices 232, top chamber 240 having a gap, bottom chamber 250 having a gap, flow chamber 240/250, and anchor (i.e. support structure) 260 that are analogous to top plate 110 having vent 112, cooling element 120 having tip 121, orifice plate 130 including orifices 132, top chamber 140 having gap 142, bottom chamber 150 having gap 152, flow chamber 140/150, and anchor (i.e. support structure) 160, respectively. Also shown is pedestal 290 that is analogous to pedestal 190. Thus, cooling element 220 is centrally supported by anchor 260 such that at least a portion of the perimeter of cooling element 220 is free to vibrate. In some embodiments, anchor 260 extends along the axis of cooling element 220. In other embodiments, anchor 260 is only near the center portion of cooling element 220. Although not explicitly labeled in FIGS. 2A and 2B, cooling element 220 includes an anchored region and cantilevered arms including step region, extension region, and outer regions analogous to anchored region 122, cantilevered arms 123, step region 124, extension region 126, and outer region 128 of cooling element 120'. In some embodiments, cantilevered arms of cooling element 220 are driven in-phase. In some embodiments, cantilevered arms of cooling element 220 are driven out-of-phase. In some embodiments, a simple cooling element, such as cooling element 120, may be used.

Anchor 260 supports cooling element 220 from above. Thus, cooling element 220 is suspended from anchor 260. Anchor 260 is suspended from top plate 210. Top plate 210 includes vent 213. Vents 212 on the sides of anchor 260 provide a path for fluid to flow into sides of chamber 240.

As discussed above with respect to cooling system 100, cooling element 220 may be driven to vibrate at or near the structural resonant frequency of cooling element 220. Further, the structural resonant frequency of cooling element 220 may be configured to align with the acoustic resonance of chamber 240/250. The structural and acoustic resonant frequencies are generally chosen to be in the ultrasonic range. For example, the vibrational motion of cooling element 220 may be at the frequencies described with respect to cooling system 100. Consequently, efficiency and flow rate may be enhanced. However, other frequencies may be used.

Cooling system 200 operates in an analogous manner to cooling system 100. Cooling system 200 thus shares the benefits of cooling system 100. Thus, performance of a device employing cooling system 200 may be improved. In addition, suspending cooling element 220 from anchor 260 may further enhance performance. In particular, vibrations in cooling system 200 that may affect other cooling cells (not shown) may be reduced. For example, less vibration may be induced in top plate 210 due to the motion of cooling element 220. Consequently, cross talk between cooling system 200 and other cooling systems (e.g. other cells) or other portions of the device incorporating cooling system 200 may be reduced. Thus, performance may be further enhanced.

Figure 3A:
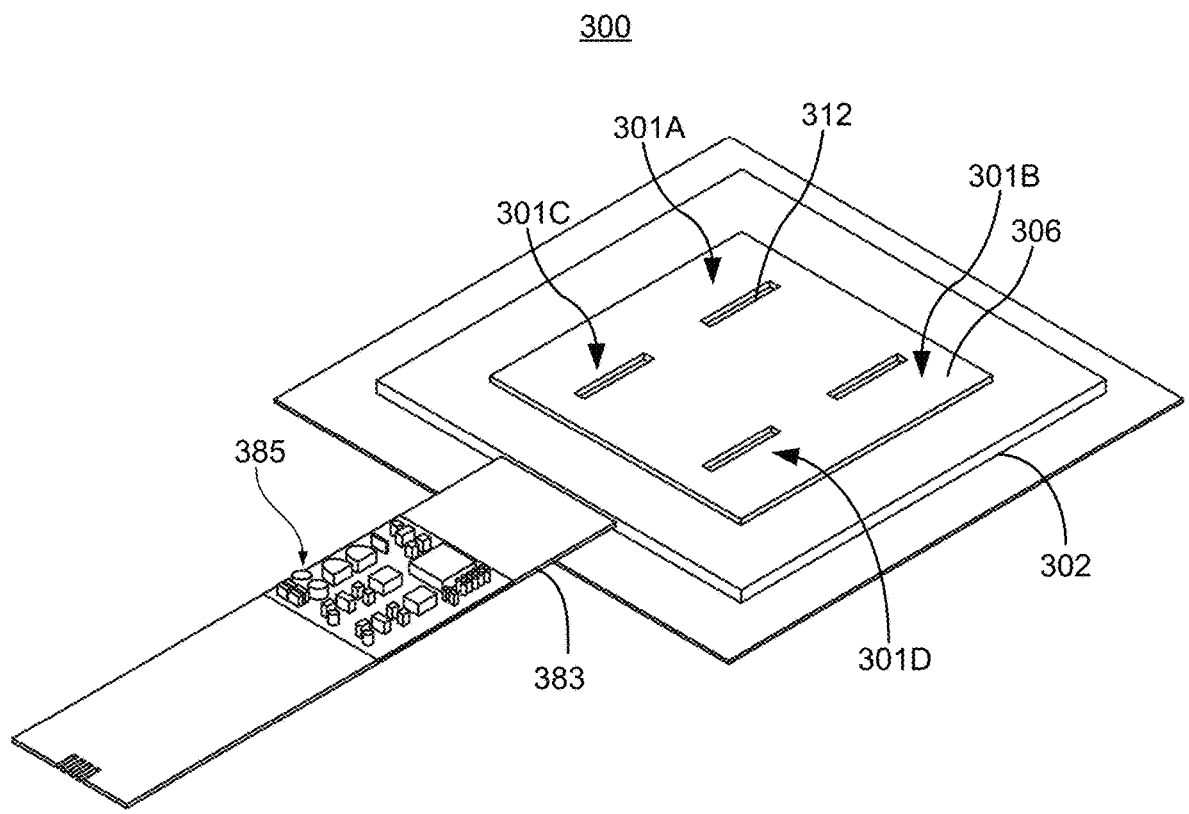
FIGS. 3A-3E depict an embodiment of an active MEMS cooling system formed in a tile.
Figure 3B:
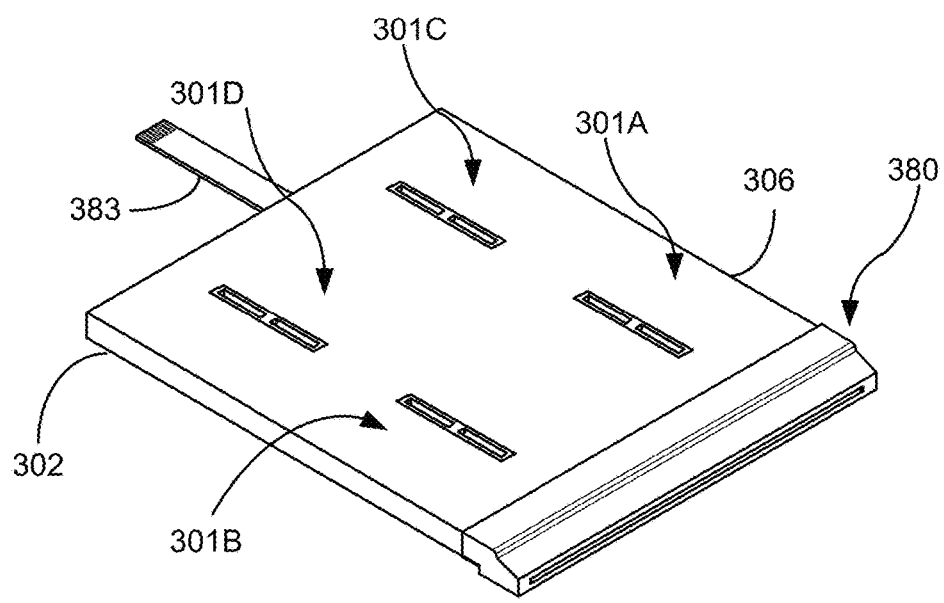
Figure 3C:
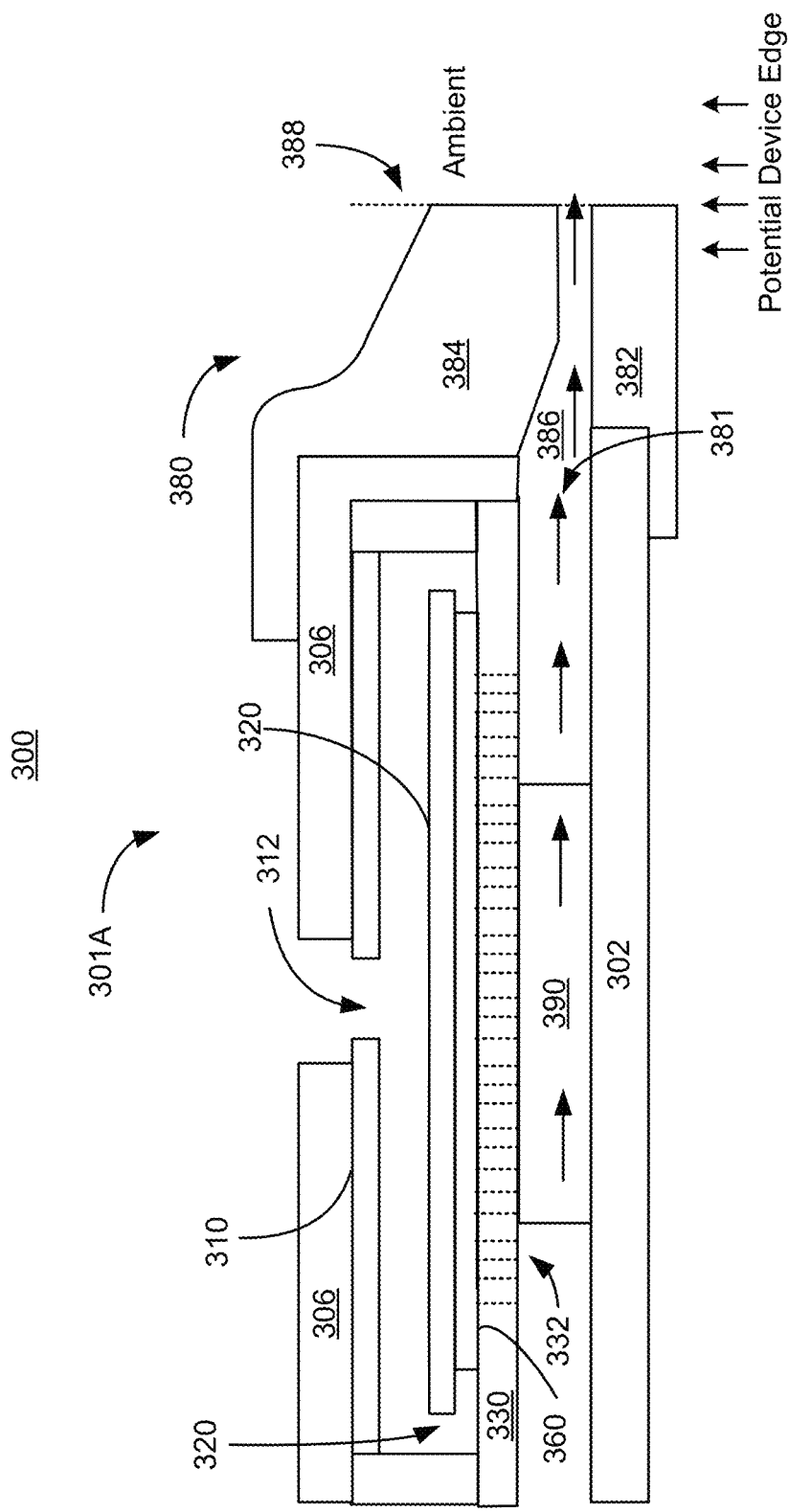
Figure 3D:
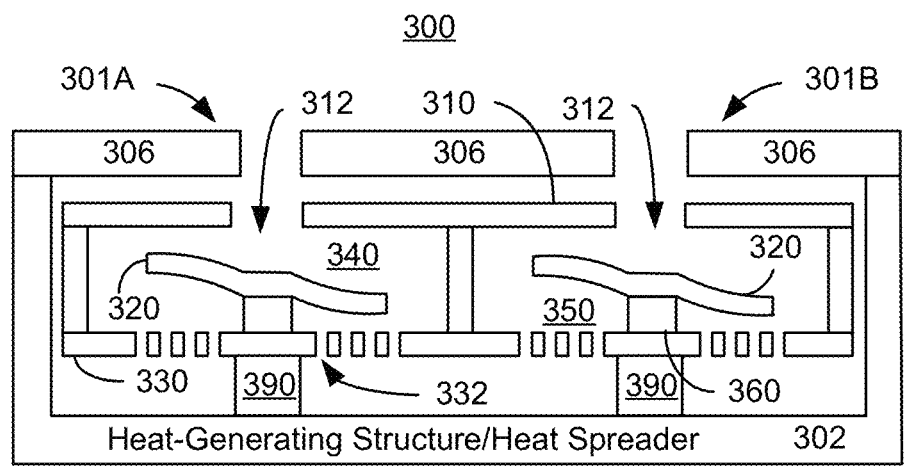
Figure 3E:
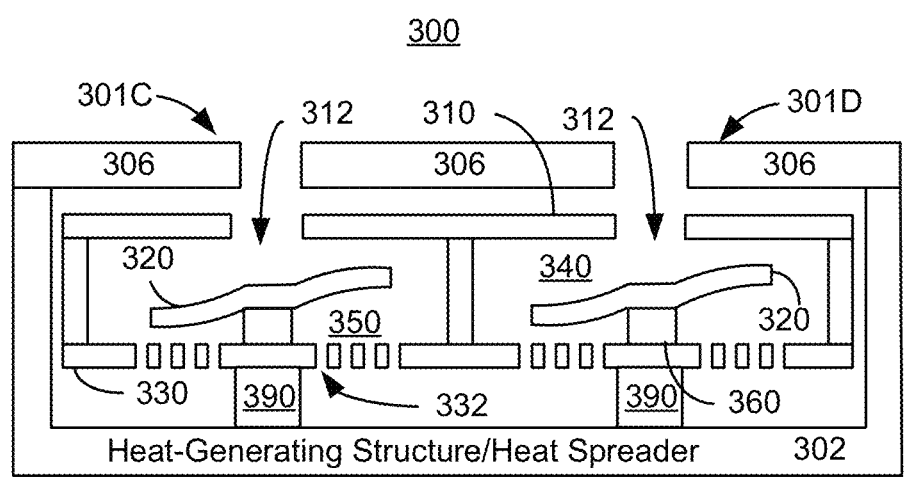

FIGS. 3A-3E depict an embodiment of active MEMS cooling system 300 including multiple cooling cells configured as a module termed a tile, or array. FIG. 3A depicts a perspective view with cover 306 and spout 380 removed. FIG. 3B depicts active MEMS cooling system 300 with cover 306 and spout 380. FIG. 3C depicts a side view of a portion of cooling system 300. FIGS. 3D-3E depict side views of cooling system 300. FIGS. 3A-3E are not to scale. Cooling system 300 includes four cooling cells 301A, 301B, 301C and 301D (collectively or generically 301), which are analogous to one or more of cooling systems described herein. More specifically, cooling cells 301 are analogous to cooling system 100 and/or 200. Tile 300 thus includes four cooling cells 301 (i.e. four MEMS jets). Although four cooling cells 301 in a 2×2 configuration are shown, in some embodiments another number and/or another configuration of cooling cells 301 might be employed. In the embodiment shown, cooling cells 301 include shared top plate 310 having apertures 312, cooling elements 320, shared orifice plate 330 including orifices 332, top chambers 340, bottom chambers 350, anchors (support structures) 360, and pedestals 390 that are analogous to top plate 110 having apertures 112, cooling element 120, orifice plate 130 having orifices 132, top chamber 140, bottom chamber 150, anchor 160, and pedestal 190. In some embodiments, cooling cells 301 may be fabricated together and separated, for example by cutting through top plate 310, side walls between cooling cells 301, and orifice plate 330. Thus, although described in the context of a shared top plate 310 and shared orifice plate 330, after fabrication cooling cells 301 may be separated. In some embodiments, tabs (not shown) and/or other structures such as anchors 360 may connect cooling cells 301. Further, tile 300 includes heat-generating structure (termed a heat spreader hereinafter) 302 (e.g. a heat spreader, a heat spreader, and/or other structure) that also has sidewalls, or fencing, in the embodiment shown. Cover 306 having apertures therein is also shown. In some embodiments, a dust filter (not shown) may be provided for the apertures. In such embodiments, dust may be less likely to reach the interior of cooling system 300. In some embodiments, a water tight, air porous membrane may be provided for the apertures. Heat spreader 302. cover 306, and spout 380 may be part of an integrated tile 300 as shown or may be separate from tile 300 in other embodiments. Heat spreader 302 and cover plate 306 may direct fluid flow outside of cooling cells 301, provide mechanical stability, and/or provide protection. Electrical connection to cooling cells 301 is provided via flex connector 383 (not shown in FIGS. 3C-3E) which may house drive electronics 385. Cooling elements 320 are driven out-of-phase (i.e. in a manner analogous to a seesaw). Further, as can be seen in FIGS. FIGS. 3D-3E cooling element 320 in one cell is driven out-of-phase with cooling element(s) 320 in adjacent cell(s). Cooling element 320 in cell 301C is out-of-phase with cooling element 320 in cell 301D. In FIGS. 3D-3E, cooling elements 320 in a column are driven out-of-phase. Thus, cooling element 320 in cell 301A is out-of-phase with cooling element 320 in cell 301C. Similarly, cooling element 320 in cell 301B is out-of-phase with cooling element 320 in cell 301D. By driving cooling elements 320 out-of-phase, vibrations in cooling system 300 may be reduced. Cooling elements 320 may be driven in another manner in some embodiments.

Cooling system 300 also includes spout 380 having dissipation region 386 therein. Spout 380 includes a housing having bottom 382 and top 384, entrance 381 and exit 386. Entrance 381 is fluidically coupled with orifices 332 (i.e. egresses from flow chamber 340/450). The direction of fluid flow from flow chamber 340/450 may be seen by the unlabeled arrows in FIG. 3C. Spout 380 operates to smooth pulsations in the pressure waves generated by cooling elements 320. Because cooling elements 320 vibrate, the flow of fluid pulsates. Thus, the pressure of the fluid also pulsates between higher and lower pressures. Flow may also exit orifices 332 and travel through the jet channel in pulses. The pressure within flow chamber 340/350 and the jet channel is higher than the pressure of the ambient region. The fluid exits the jet channel and enters spout 380 at entrance 381. The fluid travels through dissipation region 386 and to exit 388. The pulsating pressure in the fluid is dissipated in dissipation region 384. Stated differently, the pulsating pressure way may be attenuated such that the pressure equilibrates and approaches (or reaches) the ambient pressure of the ambient region outside of system 300. In some embodiments, therefore, the pressure of the fluid at exit 388 of spout 380 matches or substantially the boundary conditions for the pressure of the ambient.

Cooling cells 301 of cooling system 300 function in an analogous manner to cooling system(s) 100, 200, and/or an analogous cooling system. Consequently, the benefits described herein may be shared by cooling system 300. Because cooling elements in nearby cells are driven out-of-phase, vibrations in cooling system 300 may be reduced. Because multiple cooling cells 301 are used, cooling system 300 may enjoy enhanced cooling capabilities. Further, multiples of individual cooling cells 301 and/or cooling system 300 may be combined in various fashions to obtain the desired footprint of cooling cells.

Systems 100, 200, and 300 are generally desired to be integrated into devices, such as computing devices, for which cooling is desired. In addition to space and other constraints, cooling systems such as systems 100, 200, and 300 are desired to maintain a higher rate of fluid flow, efficiently transfer heat from the heat-generating structure, and reduce the amount of heat transferred back into the device from the cooling systems. Thus, additional control of the fluid flow through the cooling system and the devices in which such systems are incorporated is desired.

Although described as cooling systems, systems 100, 200 and/or 300 may be considered to be differential pressure devices 100, 200 and/or 300. Similarly, cooling elements 120/120', 220, and/or 320 may be considered actuators. As such, the term differential pressure device and cooling system may be used interchangeably herein. Similarly, actuator and cooling element may be used interchangeably. Vibrational motion of actuators 120, 120', 220, and/or 320 drive flow through differential pressure devices 100, 200, and/or 300. As a result, pressure differentials are generated not only within the systems 100, 200, and/or 300, but also in the surrounding areas. Thus, flow may be driven through a larger region based on the pressure differentials created by devices 100, 200, and/or 300. FIGS. 4-13B depict various embodiments of computing devices including heat transfer structures that incorporate one or more of differential pressure devices 100, 200, and/or 300 and/or an analogous device.

Figure 4:
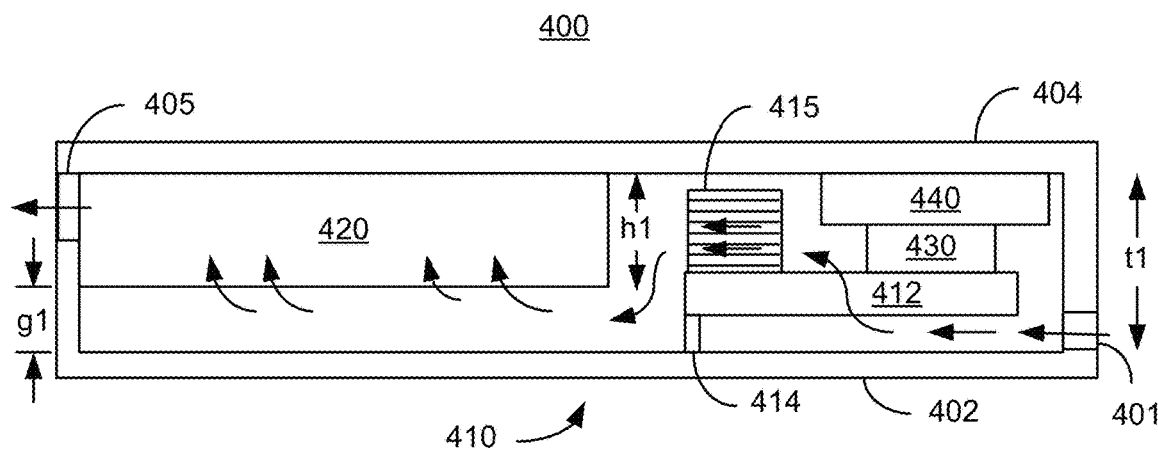
FIG. 4 depicts an embodiment of a computing device incorporating a heat transfer structure including an active MEMS differential pressure device.

FIG. 4 depicts an embodiment of computing device 400 incorporating heat transfer structure 410. Computing device 400 may be a notebook, laptop, smart phone, gaming device, or other thin computing device. Computing device 400 may include bottom cover 402 and top cover 404. Top cover 404 may include a keyboard or display. Alternatively, bottom cover 402 may include a keyboard or display. Because computing device 400 is thin, computing device 400 has a dimension (i.e. a thickness) that is significantly less than the remaining dimensions. For example, the interior of computing device 400 in which heat transfer structure 410 resides may have a height, t1, of not more than eight millimeters. In some embodiments, height t1 of the interior of computing device 400 may be not more than five millimeters. In some embodiments, t1 is not more than 3.5 millimeters. In some such embodiments, t1 is not more than three millimeters. In some embodiments, t1 is at least two millimeters. For example, t1 may be at least 3.2 millimeters and not more than 3.5 millimeters. The interior of computing device 400 in which heat transfer structure 410 resides may be considered to be a chamber. The chamber, and thus computing device 400, has ingress 401 and egress 405. Fluid (e.g. air) from exterior to computing device 400 is drawn into the chamber via ingress 401 and expelled via egress 405. In addition to heat transfer device 410, computing device 400 includes heat-generating structure 430 and circuit board 440. Heat-generating structure 430 may be one or more processors or other integrated circuit(s) mounted on circuit board 440. For simplicity, heat-generating structure 430 is referred to hereinafter as processor(s) 430. Other integrated circuits, such as dynamic random access memory (DRAM) modules (not shown) or other electrical components (not shown) may be mounted on circuit board 440.

Heat transfer device 410 includes heat spreader 412, fan structure 415, and active MEMS differential pressure device 420. Heat spreader 412 is thermally coupled to processor(s) 430, for example via thermal conduction. Thus, heat spreader 412 is in physical contact with processor(s) 430. Heat generated by processor(s) 430 is conducted to heat spreader 412. In some embodiments, heat spreader 412 is a vapor chamber. In some embodiments, heat spreader 412 may have another structure.

Fin structure 415 is thermally coupled to heat spreader 412, for example via thermal conduction. Thus, heat from heat spreader 412 is transferred to fin structure 415. Fin structure 415 includes multiple fins (indicated in FIG. 415 by horizontal lines). Fins may be horizontal, vertical, or oriented in another manner. Fins increase the surface area exposed to the fluid (e.g. air) drawn through heat transfer device 410. Consequently, heat may be more efficiently transferred from fin structure 415 to the fluid than from heat spreader 412 to the fluid. The fins of fin structure 415 are densely packed. In some embodiments, the fins of fin structure 415 are spaced apart (e.g. the pitch or the distance between a surface of one fin and the surface of an adjacent fin) by not more than two hundred and fifty micrometers. In some embodiments, the fins of fin structure 415 are not more than one hundred and fifty micrometers apart. In some embodiment, the fins of fin structure 415 are not more than one hundred micrometers apart. In some such embodiments, the fins are at least fifty micrometers apart.

Differential pressure device 420 is a differential pressure device analogous to cooling systems 100, 200, and/or 300. In some embodiments, differential pressure device 420 is most analogous to cooling system 300 in that multiple cooling cells are present. In some embodiments, differential pressure device 420 includes three tiles 300 (i.e. twelve cooling cells 301). Differential pressure device 420 may have a bottom plate analogous to bottom plate 302 and a cover analogous to cover 306. The bottom plate of differential pressure device 420 is coupled to top cover 404. In some embodiments, a thin insulator is between the bottom plate of differential pressure device 420 and top cover 404. This may aid in controlling the skin temperature of computing device 400, while allowing for cooling of processor (s) 430. As indicated in FIG. 4, in some embodiments, the height, t1 of the interior of computing device 400 may be sufficiently small that differential pressure device 420 is not connected to heat spreader 412. Stated differently, heat from heat spreader 412 may not be transferred to differential pressure device 420 via thermal conduction.

Differential pressure device 420 provides a pressure differential that drives fluid flow through heat transfer structure 410 and, therefore, computing device 400. Stated differently, differential pressure device 420 generates a region of low pressure within computing device 400 that draws fluid through heat transfer structure 410. In some embodiments, this region is proximate to the entrance to differential pressure device 420. For example, the region of low pressure may be between fin structure 415 and differential pressure device 420. The direction that fluid (e.g. air) flows through computing device 400 is indicated by the unlabeled arrows in FIG. 4. Fluid is drawn in via ingress 401, flows along the gap between heat spreader 412 and back cover 402, around (or through apertures in) heat spreader 412 and through fin structure 415. Heat transfer device 410 is configured such that the fluid is driven through fin structure 415. For example, in the embodiment shown, structure 414 blocks the flow of the fluid in the gap between heat spreader 412 and bottom cover 402. Thus, most or all of the fluid drawn in through ingress 401 passes through or around fin structure 415 and to differential pressure device 420. Fluid flows between and along the surfaces of the fins of fin structure 415, into differential pressure device 420, out of differential pressure device 420 and out of egress 405.

The fluid flow is used to transfer heat from processor(s) 430. Heat is transferred from processor(s) 430 to heat spreader 412. Some heat may be transferred from heat spreader 412 to the fluid passing the surfaces of heat spreader 412. However, most or all of the heat is transferred from heat spreader 412 to fin structure 415 via thermal conduction. Because of the large surface area of fin structure 415, heat is transferred efficiently from fin structure 415 to the fluid. Heated fluid from fin structure 415 is drawn into differential pressure device 420 due to the vibrational motion of actuators therein. In contrast to the discussion with respect to cooling systems 100, 200, and 300, most if not all of the heat transfer to the fluid takes place before the fluid enters differential pressure device 420 (i.e. primarily via fins 415). Fluid, and thus heat, is ejected from differential pressure device 420 and out of computing device 400. In some embodiments, the fluid flowing due to differential pressure device 420 is such that greater than 2 W of heat is ejected from egress 405. In some embodiments, at least 6 W of heat is ejected from the egress 405. This may occur where differential pressure device 420 includes three tiles 300. Thus, in this context, differential pressure device 420 functions to cool processor 430 by generating a pressure difference with the chamber housing heat transfer structure 410 that draws fluid through computing device 400 and, therefore, through fin structure 415.

In some embodiments, the heat transfer structure 410 restricts flow driven by differential pressure device 420 such that a pressure differential of at least a one hundred Pascals per cubic feet per minute (cfm) (100 Pa/cfm) is within the chamber. In some such embodiments, the pressure differential within the chamber is at least four hundred pascals per cfm (400 Pa/cfm). The pressure differential may be at least five hundred pascals per cfm (500 Pa/cfm). In some embodiments, the majority of the flow restriction is due to fin structure 415. Thus, differential pressure device 420 is configured such that this pressure differential can be achieved. For example, if a flow of 0.5 cfm is provided by differential pressure device 420, a pressure difference of 200 Pa, 400 Pa, or 1000 Pa is provided. This pressure difference is primarily across fin structure 415 in some embodiments.

For example, in some embodiments, differential pressure device 420 is configured to have a backpressure of at least 1500 Pa. In some embodiments, the backpressure of differential pressure device 420 is at least 1600 Pa. In some embodiment, the backpressure of differential pressure device 420 is at least 1700 Pa and not more than 1800 Pa (e.g. nominally 1750 Pa). As used herein, the backpressure of differential pressure device 420 indicates the pressure at which differential pressure device 420 can no longer drive flow. The high backpressures described herein may be achieved for differential pressure device 420 utilizes one or more tiles 300 including four cells. In some embodiments, a tile 300 has a backpressure of nominally 1750 Pa (e.g. at least 1700 and not more than 1800 Pa) and provides a flow of at least 0.15 cubic feet per minute (cfm). In some such embodiments, the flow provided is at least 0.2 cfm for tile 300. In some embodiments, differential pressure device 420 includes three such tiles 300. Thus, differential pressure device 420 may provide a flow rate of nominally 0.5 cfm while maintaining the pressure difference of 200 Pa or 400 Pa within the chamber containing heat transfer device 410 (and in some embodiments across fin structure 415). Further, because the backpressure of differential pressure device 420 may be high, a pressure difference of 200 Pa or 400 Pa within the chamber does not significantly reduce the flow. For example, for 200 Pa of resistance to flow by fin structure 415 and the remainder of heat transfer structure 410 (i.e. a pressure difference of at least 200 Pa that is to be provided by differential pressure device 420), the fluid flow provided by differential pressure device 420 may be reduced by approximately eleven percent from the maximum flow.

In addition to providing a high pressure and a meaningful fluid flow, differential pressure device 420 has a low profile. In some embodiments, differential pressure device 420 may have a total height (h1) of not more than 3.5 millimeters. In some embodiments, differential pressure device 420 may have a total height of not more than 3 millimeters. In some embodiments, the total height, h1, is not more than 2.8 millimeters. In some embodiments, the height of differential pressure device 420 is at least two millimeters. Moreover, the low profile of differential pressure device 420 allows for a gap having height g1 to be maintained between differential pressure device 420 and bottom cover 402. In some embodiments, g1 is at least 0.3 millimeters. In some embodiments, g1 is at least 0.4 millimeters. In some such embodiments, g1 is at least 0.5 millimeters. Further, g1 may be not more than 0.7 millimeters. Because such a gap is between differential pressure device 420 and bottom cover 402, differential pressure device 420 does not unduly heat bottom cover 402. A similar gap is between heat spreader 412 and bottom cover 402. The insulating properties of such gaps are further improved because moving fluid (as opposed to stagnant fluid) is driven through these gaps. As a result, the temperature of bottom cover 402 may be managed. For example, hot spots may be avoided and the skin temperature (i.e. the external temperature) of bottom cover 402 may remain within tolerances. For example, the skin temperature of bottom cover may remain not more than forty-five degrees Celsius. In some such embodiments, the skin temperature of bottom cover does not exceed forty degrees Celsius. Although differential pressure device 420 is coupled to top cover 404, an insulator may be interposed between top cover 404 and differential pressure device 420. Thus, top cover 404 may also have a skin temperature in the same range as that of bottom cover 402.

Computing system 400 may have improved performance. Fin structure 415 is thermally coupled via conduction to heat spreader 412 and, therefore, processor(s) 430. Thus, heat is efficiently transferred from processor(s) 430 to fin structure 415. Stated differently, the temperature drop between processor(s) 430 and fin structure 415 may be small or negligible. Fin structure 415 provides a significant surface area that can be cooled via fluid flow passing through its fins. Thus, heat may be efficiently transferred from fin structure 415 to the fluid. Differential pressure device 420 may provide a significant fluid flow (e.g. at least 0.15 cfm, at least 0.2 cfm, at least 0.4 cfm, or at least 0.5 cfm) through heat transfer structure 410 despite a high pressure differential for fin structure 415. For example, in some embodiments (e.g. where differential pressure device 420 includes three tiles 300), sufficient cooling may be provided that processor 430 can be run such that processor 430 consumes at least thirty percent to sixty percent more power while maintaining the desired skin temperature of covers 402 and/or 404. Stated differently, a higher die temperature may be maintained (and performance of processor(s) 430 improved) for a given skin temperature of computing device 400. This cooling is achieved without differential pressure device 420 being thermally coupled to heat spreader 412 via conduction. Although heated fluid is ejected from egress 405, in some embodiments, this fluid is traveling at a sufficient speed that air in the surrounding environment is entrained. This cooler air rapidly mixes with the heated air from differential pressure device 420. Thus, the temperature of the region more than 1-3 millimeters from egress 405 is not hot enough to burn a user of computing device 400. Moreover, the exit (e.g. spout) of differential pressure device 420 is at or near egress 405 of computing system. For example, the exit may be flush with or within 1-4 millimeters of the outside of the casing of computing device 400. This region may also be sealed, for example using aerogel. Hot fluid exiting differential pressure device 420 is not recirculated within computing device 400. Consequently, cooling efficiency may be improved.

Further, heat transfer structure 410 provides cooling and improved performance while having a low profile. More specifically, heat transfer structure 410, and differential pressure device 420, have a sufficiently low profile that they fit within the thickness, t1, of the interior of computing device 400. Thus, heat transfer structure 410 including differential pressure device 420 may have a total thickness of not more than t1 (e.g. 5 millimeters, 3.5 millimeters, or 3 millimeters). Consequently, superior cooling may be provided for thin computing devices, allowing for improved performance of such computing devices.

Figure 5:
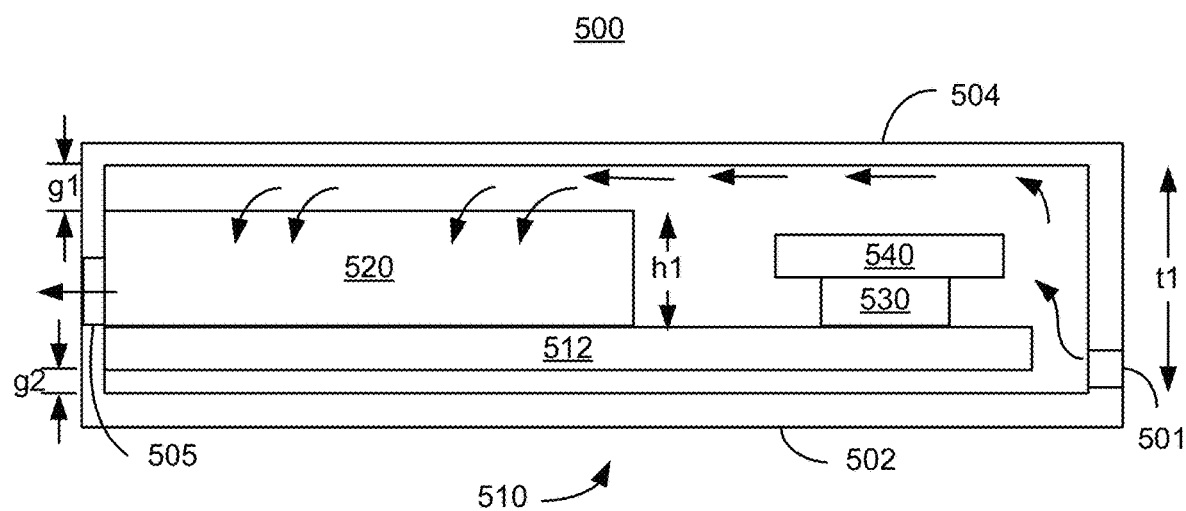
FIG. 5 depicts an embodiment of a computing device incorporating a heat transfer structure including an active MEMS differential pressure device.

FIG. 5 depicts an embodiment of computing device 500 incorporating heat transfer structure 510. Computing device 500 may be a notebook, laptop, smart phone, gaming device, or other thin computing device. Computing device 500 may include bottom cover 502 and top cover 504. Top cover 504 may include a keyboard or display. Alternatively, bottom cover 502 may include a keyboard or display. Because computing device 500 is thin, computing device 500 has a dimension (i.e. a thickness) that is significantly less than the remaining dimensions. For example, the interior of computing device 500 in which heat transfer structure 510 resides may have a height, t1, of not more than eight millimeters. In some embodiments, height t1 of the interior of computing device 500 may be not more than five millimeters. In some embodiments, t1 is not more than 3.5 millimeters. In some such embodiments, t1 is not more than three millimeters. In some embodiments, t1 is at least two millimeters. For example, t1 may be at least 4.7 millimeters and not more than 5.3 millimeters (i.e. nominally 5 millimeters). The interior of computing device 500 in which heat transfer structure 510 resides may be considered to be a chamber. The chamber, and thus computing device 500, has ingress 501 and egress 505. Fluid (e.g. air) from exterior to computing device 500 is drawn into the chamber via ingress 501 and expelled via egress 505. In addition to heat transfer device 510, computing device 500 includes heat-generating structure 530 and circuit board 540. Heat-generating structure 530 may be one or more processors or other integrated circuit(s) mounted on circuit board 540. For simplicity, heat-generating structure 530 is referred to hereinafter as processor(s) 530. Other integrated circuits, such as dynamic random access memory (DRAM) modules (not shown) or other electrical components (not shown) may be mounted on circuit board 540.

Heat transfer device 510 includes heat spreader 512 and active MEMS differential pressure device 520. Heat spreader 512 is thermally coupled to processor(s) 530, for example via thermal conduction. Thus, heat spreader 512 is in physical contact with processor(s) 530. Heat generated by processor(s) 530 is conducted to heat spreader 512. In some embodiments, heat spreader 512 is a vapor chamber. In some embodiments, heat spreader 512 may have another structure.

Differential pressure device 520 is a differential pressure device analogous to cooling systems 100, 200, 300, and/or 420. Differential pressure device 520 is most analogous to differential pressure device 420. In some embodiments, multiple cooling cells are present. For example, differential pressure device 520 may include three tiles 300 (i.e. twelve cooling cells 301). Differential pressure device 520 may have a bottom plate analogous to bottom plate 302 and a cover analogous to cover 306. The bottom plate of differential pressure device 520 is coupled to heat spreader 512. Therefore, heat from heat spreader 512 may be transferred to differential pressure device 520 via thermal conduction.

Differential pressure device 520 provides a pressure differential that drives fluid flow through heat transfer structure 510 and, therefore, computing device 500. Stated differently, differential pressure device 520 generates a region of low pressure within computing device 500 that draws fluid through heat transfer structure 510. In some embodiments, this region is proximate to the entrance to differential pressure device 520. The direction that fluid (e.g. air) flows through computing device 500 is indicated by the unlabeled arrows in FIG. 5. Fluid is drawn in via ingress 501, flows along the gap between circuit board 540 and top cover 504, and into differential pressure device 520. The pressure differentials that are capable of being provided as well as the fluid flows described in the context of heat transfer structure 410 and differential pressure device 420 may be provided by heat transfer structure 510 and differential pressure device 520. However, the manner in which heat is transferred may differ somewhat.

The fluid flow driven by differential pressure device 520 is used to transfer heat from processor(s) 530. Heat is efficiently transferred from processor(s) 530 to heat spreader 512 via conduction. Thus, the temperature of heat spreader 512 may be at or near that of processor(s) 530. Some heat may be transferred from heat spreader 512 to the fluid passing the surfaces of heat spreader 512. However, most or all of the heat is transferred from heat spreader 512 to differential pressure device 520 via thermal conduction. Fluid entering differential pressure device 520 may be heated only slightly as it traverses the chamber of computing device 500. Thus, relatively cool fluid enters differential pressure device 520. Heat is transferred from differential pressure device 520 to the fluid in an analogous manner to that described for systems 100, 200, and/or 300. Fluid, and thus heat, is ejected from differential pressure device 520 and out of computing device 500 via egress 505. In some embodiments, the fluid flowing due to differential pressure device 520 is such that greater than 2 W of heat is ejected from egress 505. In some embodiments, at least 6 W of heat is ejected from the egress 505. This may occur where differential pressure device 520 includes three tiles 300. The heated fluid ejected by differential pressure device 520 may entrain nearby air. This cooler air rapidly mixes with the heated air from differential pressure device 520. Thus, the temperature of the region more than 1-3 millimeters from egress 505 is not hot enough to burn a user of computing device 500. Moreover, because the exit (e.g. spout) of differential pressure device 520 is at or near egress 505 of computing system, hot fluid is not recirculated within computing device 500. Consequently, cooling efficiency may be improved.

In addition to providing improved cooling, differential pressure device 520 has a low profile. In some embodiments, differential pressure device 520 may have a total height (h1) that is analogous to that of differential pressure device 420. The low profile of differential pressure device 520 allows for a gap having height g1 to be maintained between differential pressure device 520 and top cover 504. In some embodiments, g1 for differential pressure device 520 is analogous to g1 for differential pressure device 420. Because such a gap is between differential pressure device 520 and top cover 504, differential pressure device 520 does not unduly heat top cover 504. The insulating properties of such a gap are further improved because moving fluid (as opposed to stagnant fluid) is driven through the gap. As a result, the temperature of top cover 504 may be managed. For example, hot spots may be avoided and the skin temperature (i.e. the external temperature) of top cover 504 may remain within tolerances. For example, the skin temperature of bottom cover may remain not more than forty-five degrees Celsius. In some such embodiments, the skin temperature of bottom cover does not exceed forty degrees Celsius. A similar gap is between heat spreader 512 and bottom cover 502. Thus, the temperature of bottom cover 502 may also be managed.

Computing system 500 may have improved performance. Differential pressure device 520 may provide a significant fluid flow through heat transfer structure 510 that differential pressure device 520 may efficiently transfer heat to the fluid. For example, inlet fluid (e.g. air) at approximately 25 degrees Celsius traveling through computing device 500 and to differential pressure device 520 may increase in temperature to approximately 40-45 degrees Celsius (as it removes heat from the processor(s) 530 and heat spreader 512). Differential pressure device 520 and heat spreader 512 may be at approximately 70-75 degrees Celsius. Differential pressure device 520 transfers heat to the fluid drawn into and driven through differential pressure device 520. Thus, fluid exiting the differential pressure device 520 may be at or near 70-75 degrees Celsius. As a result, a higher die temperature may be maintained (and performance of processor(s) 530 improved) for a given skin temperature of computing device 500. Entrained fluid near egress 505 rapidly lowers the temperature in the region of egress 505. The flow of cooler fluid within heat transfer structure 510 improves the insulating capabilities of the gap between differential pressure device 520 and top cover 504. Thermal management may be improved. Thus, desired temperatures at and near computing device 500 may be maintained. Further, heat transfer structure 510, and differential pressure device 520, have a sufficiently low profile that they fit within the thickness, t1, of the interior of computing device 500. Thus, heat transfer structure 510 including differential pressure device 520 may have a total thickness of not more than t1 (e.g. 5 millimeters, 3.5 millimeters, or 3 millimeters). Consequently, superior cooling may be provided for thin computing devices, allowing for improved performance of such computing devices.

Figure 6:
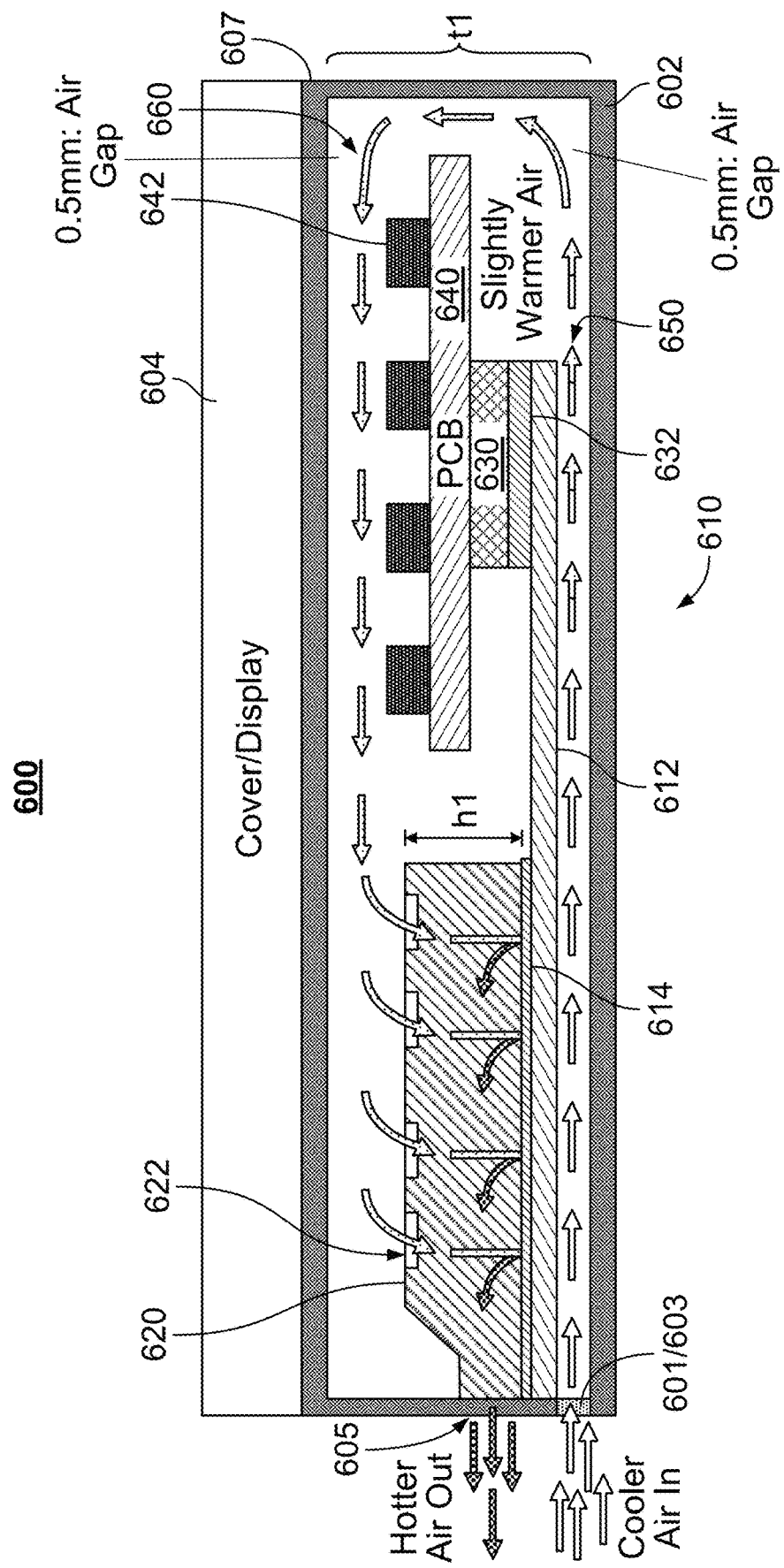
FIG. 6 depicts an embodiment of a computing device incorporating a heat transfer structure including an active MEMS differential pressure device.

FIG. 6 depicts an embodiment of computing device 600 incorporating heat transfer structure 610. Computing device 600 may be a notebook or other thin computing device. Computing device 600 is analogous to computing device 500. However, in the embodiment shown, ingress 603 and egress 605 are on the same side of computing device 600. Computing device 600 may include bottom housing 602 and top cover 604 (or display) analogous to bottom cover 502 and top cover 504. Also shown is top portion 607 that may include a keyboard. Because computing device 600 is thin, computing device 600 has a dimension (i.e. a thickness) that is significantly less than the remaining dimensions. For example, the interior of computing device 600 in which heat transfer structure 610 resides may have a height, t1, of nominally five millimeters. Other heights are possible. The interior of computing device 600 in which heat transfer structure 610 resides may be considered to be a chamber. Computing device 600 also includes ingress 601, egress 605, processor(s) 630, and printed circuit board (PCB) 640 that are analogous to ingress 501, egress 505, processor(s) 530, and circuit board 540, respectively. Also shown or labeled are filter 603, additional components 632, integrated circuits 642, lower air gap 650, and upper air gap 660. Filter 603 may be utilized to help prevent dust from entering computing system 600. For example, filter 603 may be a MERV 12 or MERV 14 filter. Components 632 may include a stage and/or thermal interface material that are used to provide good mechanical and thermal connection between heat spreader 612 and processor(s) 630. Integrated circuits 642 may include dynamic random access memory (DRAM) and/or other components. Thus, components 630 and 642 are mounted on both sides of PCB 640. Gaps 650 and 660 may be used to thermally insulate components within computing device 600 from covers 602 and 607. In some embodiments, gaps 650 and 660 are nominally 0.5 millimeters high.

Heat transfer device 610 includes heat spreader 612 and active MEMS differential pressure device 620 that are analogous to heat spreader 512 and differential pressure device 520. Heat spreader 612 is thermally coupled to processor(s) 630, for example via thermal conduction. Heat generated by processor(s) 630 is conducted to heat spreader 612. In some embodiments, heat spreader 612 is a vapor chamber. Heat transfer device 620 may also include thermal interface material 614 that is used to improve thermal connection between Differential pressure device 620 is a differential pressure device analogous to cooling systems 100, 200, 300, 420, and/or 520. Differential pressure device 620 is most analogous to and operates in a similar manner to differential pressure device 520. In some embodiments, multiple cooling cells are present. For example, differential pressure device 620 may include three tiles 300 (i.e. twelve cooling cells 301). Differential pressure device 620 may have a bottom plate (not explicitly labeled) analogous to bottom plate 302 and a cover (not explicitly labeled) analogous to cover 306. The bottom plate of differential pressure device 620 is coupled to heat spreader 612. Therefore, heat from heat spreader 612 may be transferred to differential pressure device 620 via thermal conduction. Apertures 622 in the top cover of differential pressure device 620 are also shown. Thus, fluid enters differential pressure device 620 via apertures 622.

Differential pressure device 620 provides a pressure differential that drives fluid flow through heat transfer structure 610 and, therefore, computing device 600. Differential pressure device 620 operates in an analogous manner to differential pressure device 520. The direction that fluid (e.g. air) flows through computing device 600 is indicated by the unlabeled arrows in FIG. 6. Cool fluid is drawn in via ingress 601, flows along gap 650 between heat spreader 612 and bottom cover 602, flows around PCB 640, through gap 660 between integrated circuits 642/PCB 640 and top cover/keyboard 607, and into differential pressure device 620. As the fluid flows through gap 650, some heat is transferred from heat spreader 612 to the fluid. Some additional heat may be transferred from integrated circuits 642 and/or PCB 640. This somewhat warmer air is drawn into differential pressure device 620. Most or all of the heat has been transferred from heat spreader 612 to differential pressure device 620 via thermal conduction. Thus, heat is transferred from differential pressure device 620 to the fluid in an analogous manner to that described for systems 100, 200, and/or 300. Hotter fluid is ejected from differential pressure device 620 and out of computing device 600 via egress 605. In some embodiments, the fluid flowing due to differential pressure device 620 is such that greater than 2 W of heat is ejected from egress 605. In some embodiments, at least 6 W of heat is ejected from the egress 605. The heated fluid ejected by differential pressure device 620 may entrain nearby air. This cooler air rapidly mixes with the heated air from differential pressure device 620. Thus, the temperature of the region more than 1-3 millimeters from egress 605 is not hot enough to burn a user of computing device 600.

As indicated in FIG. 6, heat transfer device 610 is capable of residing in a chamber having a height of not more than five millimeters. In some embodiments, differential pressure device 620 may have a total height (h1) that is not more than three millimeters. The low profile of differential pressure device 620 allows for gaps 650 and 660 to be maintained between differential pressure device 620 and covers 602 and 607. The insulating properties of gaps 650 and 660 are further improved because moving fluid (as opposed to stagnant fluid) is driven through gaps 650 and 660. As a result, the temperature of covers 602 and 607 (e.g. a keyboard) may be managed in a manner analogous to computing device 500.

Computing system 600 may have improved performance analogous to that of computing device 500. Differential pressure device 620 may efficiently transfer heat to the fluid in a manner analogous to differential pressure device 520. Entrained fluid near egress 605 rapidly lowers the temperature in the region of egress 605. The flow of cooler fluid within heat transfer structure 610 improves the insulating capabilities of gaps 650 and 660. Thermal management may be improved. Thus, desired temperatures at and near computing device 600 may be maintained while performance of processor 630 may be maintained or improved. Further, heat transfer structure 610, and differential pressure device 620, have a sufficiently low profile that they fit within the thickness, t1, of nominally five millimeters. Consequently, thermal management for and performance of thin computing device 600 may be improved.

Figure 7:
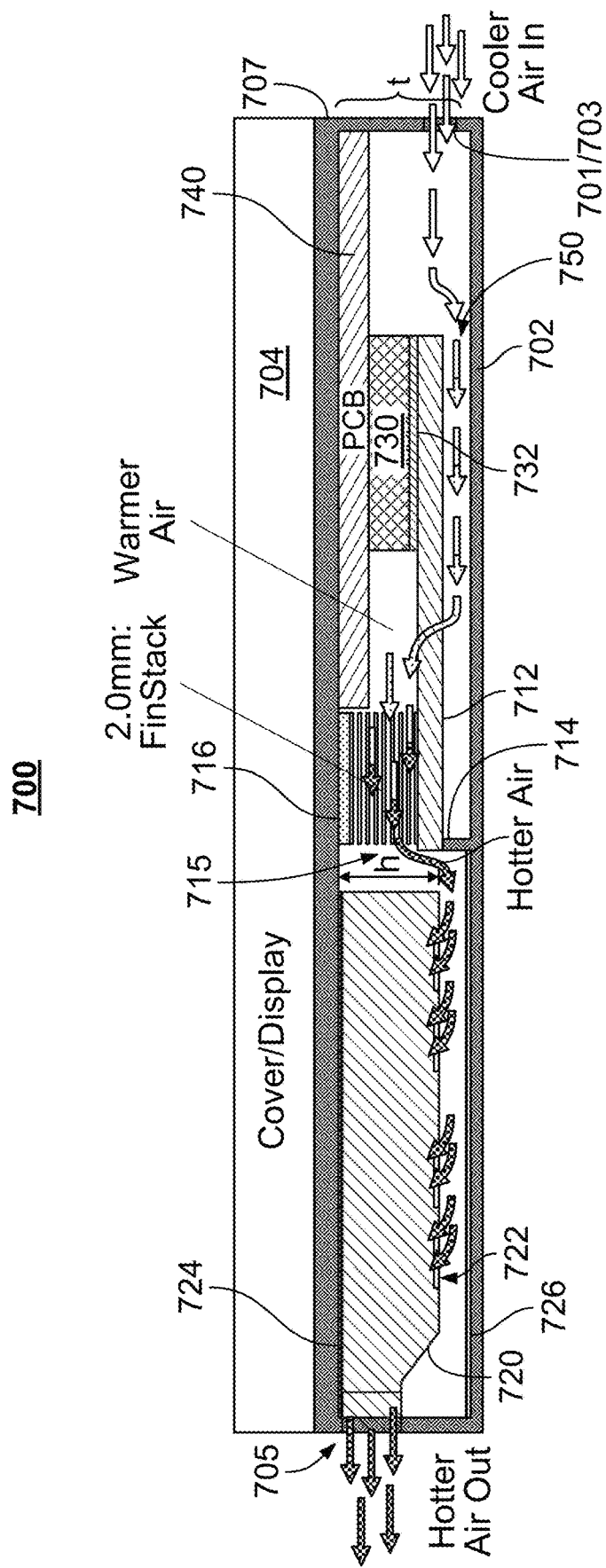
FIG. 7 depicts an embodiment of a computing device incorporating a heat transfer structure including an active MEMS differential pressure device.

FIG. 7 depicts an embodiment of computing device 700 incorporating heat transfer structure 710. Computing device 700 may be a notebook, laptop, or other thin computing device. Computing device 700 is analogous to computing device 400. Computing device 700 may include bottom housing 702 and top cover 704 (or display) analogous to bottom cover 402 and top cover 404. Also shown is top portion 707 that may include a keyboard. Because computing device 700 is thin, computing device 700 has a dimension (i.e. a thickness) that is significantly less than the remaining dimensions. For example, the interior of computing device 700 in which heat transfer structure 710 resides may have a height, t1, of nominally 3.5 millimeters. Other heights are possible. The interior of computing device 700 in which heat transfer structure 710 resides may be considered to be a chamber. Computing device 700 also includes ingress 701, egress 705, processor(s) 730, and printed circuit board (PCB) 740 that are analogous to ingress 401, egress 405, processor(s) 430, and circuit board 440, respectively. Also shown or labeled are filter 703, components 732, and air gap 750. Filter 703 may be utilized to help prevent dust from entering computing system 700. For example, filter 703 may be a MERV 12 or MERV 14 filter. Components 732 may include a stage and/or thermal interface material that are used to provide good mechanical and thermal connection between heat spreader 712 and processor(s) 730. Gap 750 may be used to thermally insulate components within computing device 700 from cover 702. In some embodiments, gap 750 is nominally 0.5 millimeters high.

Heat transfer device 710 includes heat spreader 712, structure 714, fin structure 715, and active MEMS differential pressure device 720 that are analogous to heat spreader 412, structure 414, fin structure 415, and differential pressure device 420, respectively. Heat spreader 712 is thermally coupled to processor(s) 730, for example via thermal conduction. Heat generated by processor(s) 730 is conducted to heat spreader 712. In some embodiments, heat spreader 712 is a vapor chamber. Fin structure 715 is thermally coupled to heat spreader 712 via conduction. In some embodiments, fin structure 715 is nominally two millimeters high. Also shown are insulators 716, 724, and 726. Insulators 716 and 724 may be used to thermally insulate top cover 707 from fin stack 715 and differential pressure device 720, respectively. Insulator 726 may be used in conjunction with gap 750 to insulate bottom cover 702 from differential pressure device 720. For example, insulator 716 may be a graphite panel that is nominally 0.3 millimeter thick. Insulators 724 and 726 may each be a graphite panel that is nominally 0.1 millimeter thick.

Differential pressure device 720 provides a pressure differential that drives fluid flow through heat transfer structure 710 and, therefore, computing device 700. Differential pressure device 720 generates a region of low pressure proximate to the entrance to differential pressure device 720. For example, the region of low pressure may be between fin structure 715 and differential pressure device 720. The direction that fluid (e.g. air) flows through computing device 700 is indicated by the unlabeled arrows in FIG. 7. Cooler fluid (e.g. air) is drawn in via ingress 701, flows along gap 750, around (or through apertures in) heat spreader 712 and through fin structure 715. Structure 714 blocks the flow of the fluid in the gap between heat spreader 712 and bottom cover 702 so that most or all of the fluid flows through fin structure 715. Some heat may be transferred from heat spreader 712 to the fluid. Thus, somewhat warmer air enters fin structure 715. However, most of the heat transfer to the fluid occurs via fin structure 715. Thus, hotter air is in the region between fin structure 715 and differential pressure device 720. Fluid is drawn into differential pressure device 720, driven out of differential pressure device 720, and exits computing device 700 via egress 705.

Heat transfer structure 710 restricts flow driven by differential pressure device 720. For example, fin structure 715 may have fins that are spaced apart by not more than approximately two hundred and fifty micrometers. As a result, differential pressure device 720 can provide a pressure differential of at least a one hundred Pascals per cubic feet per minute (cfm) (100 Pa/cfm) within the chamber. In some such embodiments, differential pressure device 720 provides a pressure differential within the chamber of at least four hundred pascals per cfm (400 Pa/cfm). The differential pressure device 720 provides a pressure differential within the chamber of at least five hundred pascals per cfm (500 Pa/cfm). For example, if a flow of 0.5 cfm is provided by differential pressure device 720, a pressure difference of 200 Pa, 700 Pa, or 1000 Pa is provided. This pressure difference is primarily across fin structure 715 in some embodiments. Thus, the backpressure, air flows, and pressure differential provided by differential pressure device 720 may be analogous to that of differential pressure device 420.

As indicated in FIG. 7, heat transfer device 710 is capable of residing in a chamber having a height of not more than 3.5 millimeters. In some embodiments, differential pressure device 720 may have a total height (h1) that is not more than three millimeters. In some embodiments, h1 may be not more than 2.8 millimeters. In some embodiments, h1 may be not more than 2.5-2.6 millimeters. The low profile of differential pressure device 720 allows for gap 750 to be maintained between differential pressure device 720 and cover 702. The insulating properties of gap 750 are further improved because moving fluid (as opposed to stagnant fluid) is driven through gap 750. As a result, the temperature of cover 702 may be managed. Insulators 716, 724, and 726 also aid in thermal management for covers 712 and 707 (e.g. a keyboard).

Computing system 700 may have improved performance analogous to that of computing device 400. Differential pressure device 720 allows for cooling of computing system 700 without differential pressure device 720 being thermally coupled to heat spreader 712 via conduction. Fin structure 715 efficiently transfers heat to the air flowing between its fins. The flow of through fin structure 715 is facilitated by the high backpressure and ability of differential pressure device 720 to generate a high pressure differential. Entrained fluid near egress 705 rapidly lowers the temperature in the region of egress 705. The flow of cooler fluid within heat transfer structure 710 improves the insulating capabilities of gap 750. Thermal management may be improved. Thus, desired temperatures at and near computing device 700 may be maintained while maintaining or improving performance of processor(s) 730. Further, heat transfer structure 710, fin structure 715, and differential pressure device 720, have a sufficiently low profile that they fit within the thickness, t1, of nominally 3.5 millimeters. Consequently, thermal management for and performance of thin computing device 700 may be improved.

Figure 8:
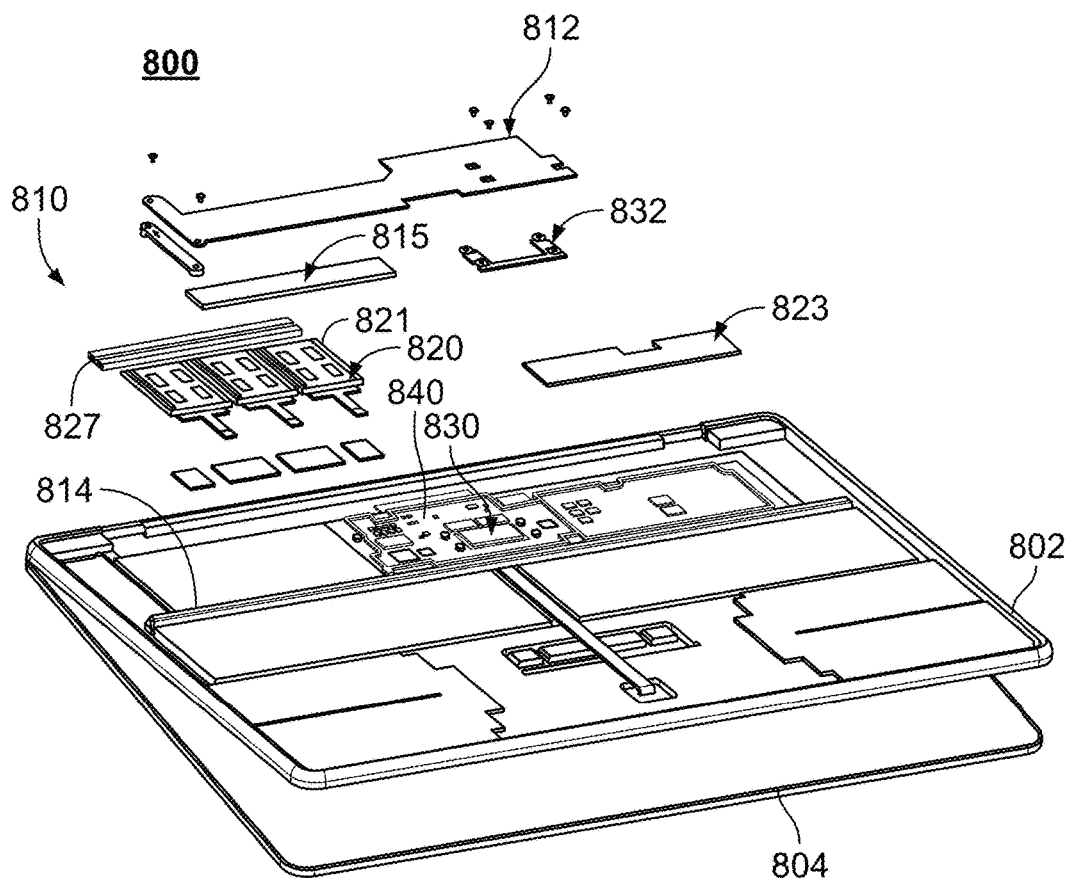
FIG. 8 depicts an embodiment of a computing device incorporating a heat transfer structure including an active MEMS differential pressure device.

FIG. 8 depicts an embodiment of computing device 800 incorporating heat transfer structure 810. Computing device 800 may be a notebook, laptop, or other thin computing device. Computing device 800 is analogous to computing device(s) 400 and/or 700. Computing device 800 may include bottom housing 802 and top cover 804 (or display) analogous to bottom cover 402/702 and top cover 404/702. Computing device 800 has a thickness analogous to that of computing device 700. For example, the interior of computing device 800 in which heat transfer structure 810 resides may have a height of nominally 3.5 millimeters. Other heights are possible.

Computing device 800 also includes ingress (not labeled), egress (not labeled), processor(s) 830, and PCB 840 that are analogous to ingress 401/701, egress 405/705, processor(s) 430/730, and circuit board 440/740, respectively.

Heat transfer device 810 includes heat spreader 812, structure 814, fin structure 815, active MEMS differential pressure device 820, and stage 832 that are analogous to heat spreader 412/712, structure 414, fin structure 415/715, differential pressure device 420/720, and components 732, respectively. Also shown is differential pressure device drive board 823 that provides electrical signals to differential pressure device 820. The three tiles 821 (only one of which is labeled) and spout 827 of differential pressure device 820 are also shown. Spout 827 is analogous to spout 380 for tile 300.

Heat transfer device 810 functions in an analogous manner to heat transfer device 410 and/or 710. Computing system 800 may have improved performance analogous to that of computing device(s) 400 and/or 700. Differential pressure device 820 allows for cooling of computing system 800 without differential pressure device 820 being thermally coupled to heat spreader 812 via conduction. Fin structure 815 efficiently transfers heat to the air flowing between its fins. The flow of through fin structure 815 is facilitated by the high backpressure and ability of differential pressure device 820 to generate a high pressure differential. Entrained fluid near the egress of computing system 800 rapidly lowers the temperature of fluid in the region of the egress. Thus, desired temperatures at and near computing device 800 may be maintained while maintaining or improving performance of processor(s) 830. Further, heat transfer structure 810, fin structure 815, and differential pressure device 820, have a sufficiently low profile that they fit within the thickness (e.g. 3.5 millimeters or less). Consequently, thermal management for and performance of thin computing device 800 may be improved.

Figure 9:
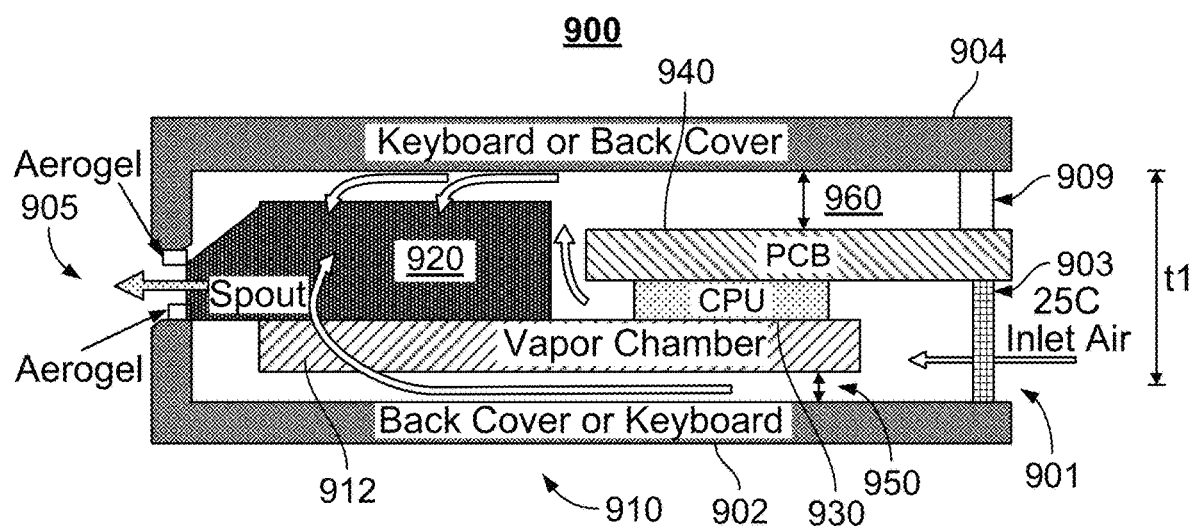
FIG. 9 depicts an embodiment of a computing device incorporating a heat transfer structure including an active MEMS differential pressure device.

FIG. 9 depicts an embodiment of computing device 900 incorporating heat transfer structure 910. Computing device 900 may be a notebook or other thin computing device. Computing device 900 is analogous to computing device(s) 500 and/or 600. Computing device 900 may include bottom cover 902, top cover 904, processor(s) 930, PCB 940, gaps 950 and 960, ingress 901, filter 903, and egress 905 analogous to bottom cover 502/602, top cover 504/604, processor(s) 530/630, circuit board(s) 540/640, gaps 650 and 660, ingress 501/601, filter 603, and egress 505/605. A flow seal 909 that prevents fluid (e.g. air) from entering computing device 900 from that region is also shown. Further, computing device 900 is thin. For example, the interior of cooling device 900 may have a height, t1, of not more than eight millimeters. In some embodiments, height t1 of the interior of computing device 900 may be not more than five millimeters.

Heat transfer device 910 includes heat spreader 912 and active MEMS differential pressure device 920 that are analogous to heat spreader 512/612 and differential pressure device 520/620. Heat spreader 912 is thermally coupled to processor(s) 930, for example via thermal conduction. Heat generated by processor(s) 930 is conducted to heat spreader 912. In some embodiments, heat spreader 912 is a vapor chamber. Fluid is driven by differential pressure device 920, which performs cooling in an analogous manner to differential pressure device(s) 520/620. The direction of fluid flow is shown in FIG. 9 by unlabeled arrows. Thus, fluid may flow around and/or through apertures heat spreader 912.

Heat transfer device 910 functions in an analogous manner to heat transfer device 510 and/or 610. Computing system 900 may have improved performance analogous to that of computing device(s) 500 and/or 600. Differential pressure device 920 may efficiently transfer heat to the fluid in a manner analogous to differential pressure device(s) 520 and/or 620. Entrained fluid near egress 905 rapidly lowers the temperature in the region of egress 905. The flow of cooler fluid within heat transfer structure 910 improves the insulating capabilities of gaps 950 and 960. Thermal management may be improved. Thus, desired temperatures at and near computing device 900 may be maintained while performance of processor 930 may be maintained or improved. Further, heat transfer structure 910, and differential pressure device 920, have a sufficiently low profile that they fit within the thickness of computing device 900. Consequently, thermal management for and performance of thin computing device 900 may be improved.

Figure 10A:
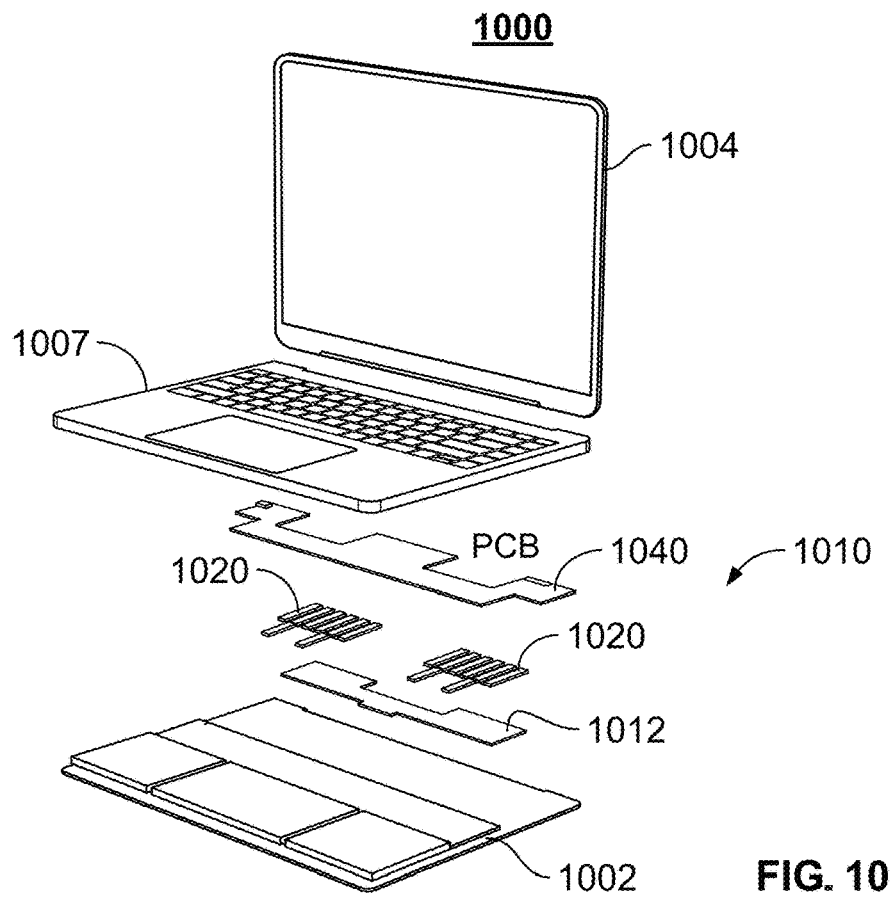
FIGS. 10A and 10B depict an embodiment of a computing device incorporating a heat transfer structure including an active MEMS differential pressure device in an exploded view and in an air flow view.
Figure 10B:
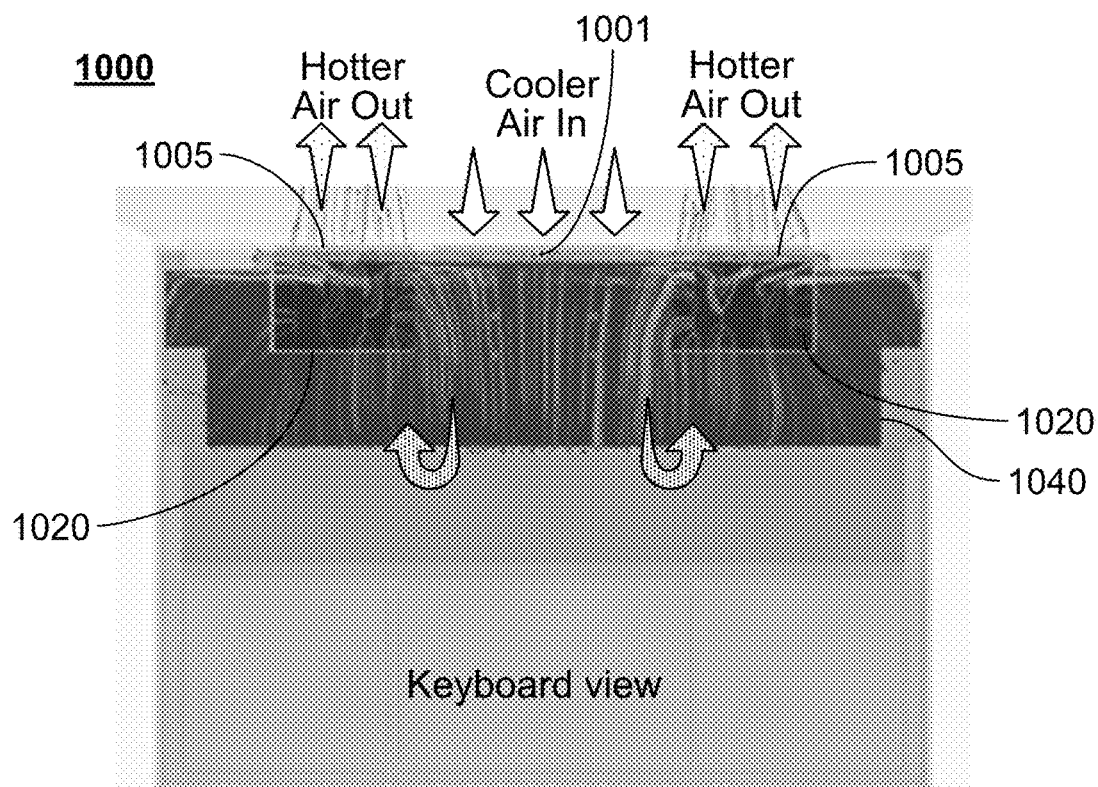

FIGS. 10A and 10B depict an exploded view and an air flow (or keyboard) view of an embodiment of computing device 1000 incorporating heat transfer structure 1010. Computing device 1000 is a thin computing device having an interior height analogous to that described herein. Computing device 1000 is analogous to computing device(s) 500, 600, and/or 900. Computing device 1000 may include bottom cover 1002, top cover/display 1004, keyboard 1007, processor(s) (not labeled), PCB 1040, ingress 1001, and egress 1005 analogous to bottom cover 502/602/902, top cover 504/604/904, processor(s) 530/630/930, circuit board(s) 540/640/940, ingress 501/601/901, and egress 505/605/905.

Heat transfer device 1010 includes heat spreader 1012 and active MEMS differential pressure device 1020 that are analogous to heat spreader 512/612/912 and differential pressure device 520/620/920. Heat spreader 1012 is thermally coupled to processor(s), for example via thermal conduction. In some embodiments, heat spreader 1012 is a vapor chamber. Fluid is driven by differential pressure device 1020, which performs cooling in an analogous manner to differential pressure device(s) 520/620/920. The direction of fluid flow is shown in FIG. 10B by lighter lines.

The PCB 1040 and heat spreader 1012 may also be configured to provide cooling in a low profile form factor. In some embodiments, the PCB 1040 may include cutouts (as shown) and/or apertures so that the combination of vapor chamber 1012, differential pressure devices 1020, and PCB 1040 have a reduced height. Thus, PCB 1040 and heat transfer structure 1010 may fit in the interior of a computing device having heights analogous to those described herein. Heat spreader 1012 may also have an optimized design. The size and the location of the heat spreader 1012 may be configured to reduce its size. For example, in the embodiment shown, the heat spreader 1012 includes two larger portions configured to be thermally and mechanically coupled to the differential pressure devices 1020. A narrower central region is configured to be coupled to the processor(s) (not shown in this drawing) on PCB 1040. Springs (not shown) may be used to ensure good thermal contact with the processor(s). Further, heat spreader 1012 is substantially flat and may be affixed to PCB 1040 and/or a stage (not shown) to ensure good thermal contact with the processor(s). In the embodiment shown, cool (e.g. room temperature) air enters through a central ingress 1001 in the back and exits through egresses 1005 on the same side of the computing device. Cooler fluid enters through the central inlet travels around PCB 1040 (transferring some heat and providing improved thermal insulation due to moving fluid). The fluid enters differential pressure devices 1020 through which significant heat is transferred to the fluid. The fluid exits through the egresses 1005.

Heat transfer device 1010 functions in an analogous manner to heat transfer device 510, 610, and/or 910. Computing system 1000 may have improved performance analogous to that of computing device(s) 500, 600, and/or 900. Differential pressure device 1020 may efficiently transfer heat to the fluid in a manner analogous to differential pressure device(s) 520 and/or 620. Entrained fluid near egress 1005 rapidly lowers the temperature in the region of egress 1005. The flow of cooler fluid within heat transfer structure 1010 may improve the insulating capabilities of air gaps. Thermal management may be improved. Thus, desired temperatures at and near computing device 1000 may be maintained while performance of processor(s) may be maintained or improved. Further, heat transfer structure 1010, and differential pressure device 1020, have a sufficiently low profile that they fit within the thickness of computing device 1000. Consequently, thermal management for and performance of thin computing device 1000 may be improved.

Figure 11A:
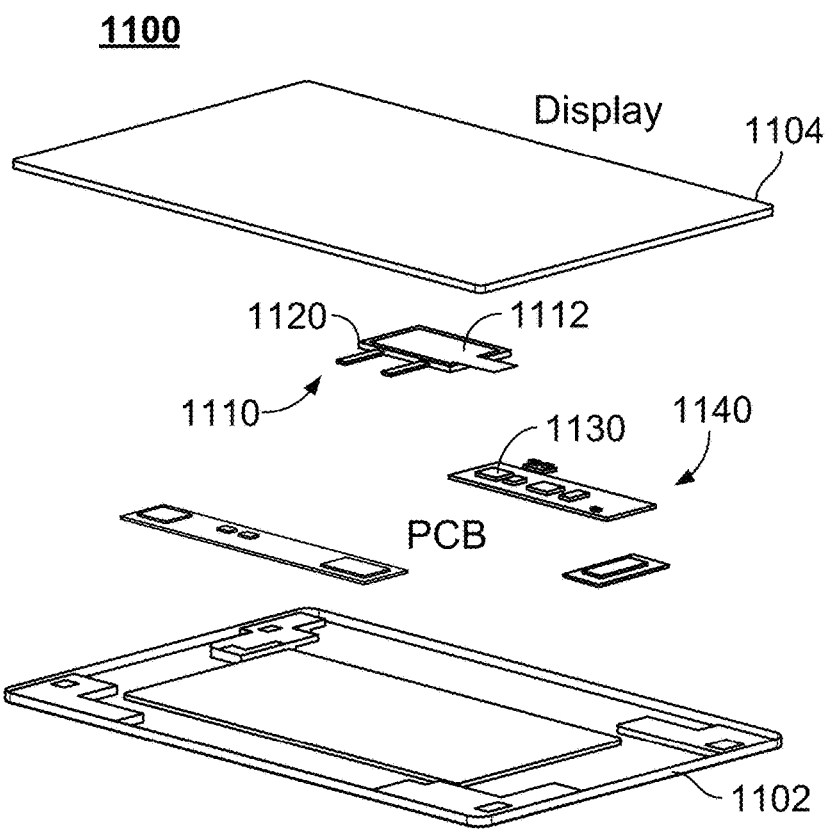
FIGS. 11A and 11B depict an embodiment of a computing device incorporating a heat transfer structure including an active MEMS differential pressure device in an exploded view and in an air flow view.
Figure 11B:
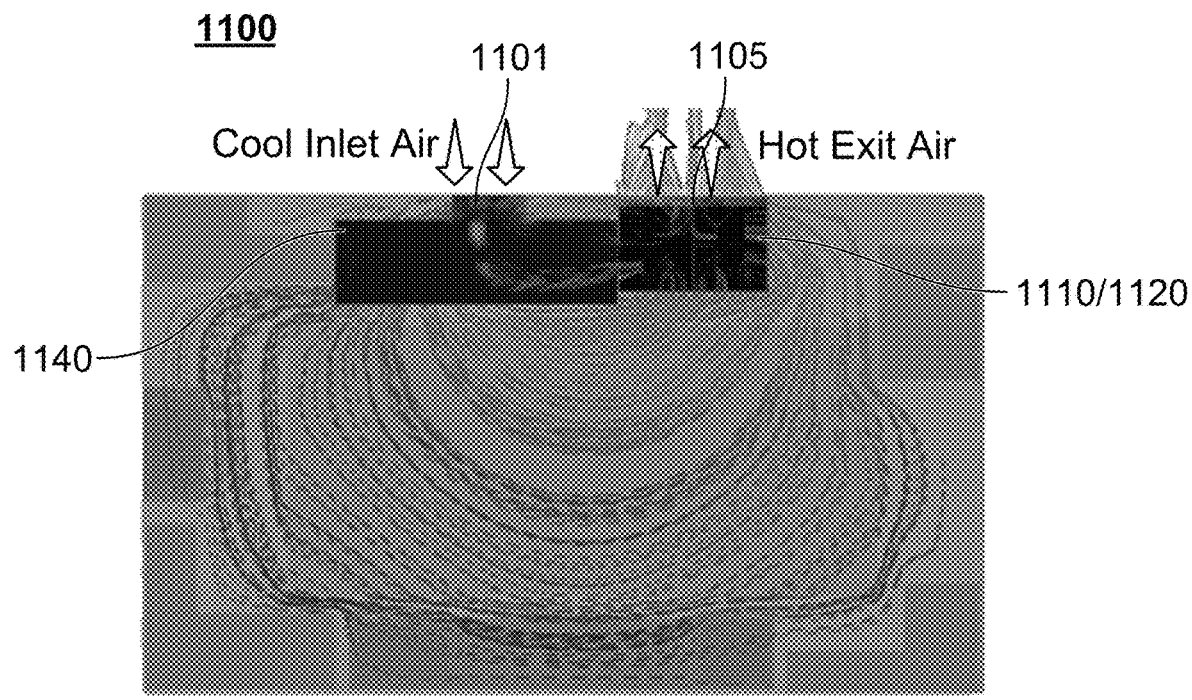

FIGS. 11A and 11B depict an exploded view and an air flow view of an embodiment of computing device 1100 incorporating a heat transfer structure including an active MEMS differential pressure device in. Computing device 1100 is a thin computing device (i.e. a notebook) having an interior height analogous to that described herein. Computing device 1100 is analogous to computing device(s) 500, 600, 900, and/or 1000. Computing device 1100 may include bottom cover 1102, top cover/display 1104, processor(s) 1130, PCB 1140, ingress 1101, and egress 1105 analogous to bottom cover 502/602/902/1002, top cover 504/604/904/1004, processor(s) 530/630/930, circuit board(s) 540/640/940/1040, ingress 501/601/901/1001, and egress 505/605/905/1005.

Heat transfer device 1110 includes heat spreader 1112 and active MEMS differential pressure device 1120 that are analogous to heat spreader 512/612/912/1012 and differential pressure device 520/620/920/1020. Heat spreader 1112 is thermally coupled to processor(s) 1130, for example via thermal conduction. In some embodiments, heat spreader 1112 is a vapor chamber. Fluid is driven by differential pressure device 1120, which performs cooling in an analogous manner to differential pressure device(s) 520/620/920/1020. The direction of fluid flow is shown in FIG. 11B by lighter lines. Thus, cool air is drawn into ingress 1101 proximate to PCB 1140, flows through the interior of computing device 1100, is drawn into differential pressure device 1120, and driven out via egress 1105. Thus, other portions of computing device 1100 may be cooled by heat transfer structure 1110.

Heat transfer device 1110 functions in an analogous manner to heat transfer device 510, 610, 910, and/or 1010. Computing system 1100 may have improved performance analogous to that of computing device(s) 500, 600, 900, and/or 1000. Consequently, thermal management for and performance of thin computing device 1100 may be improved.

Figure 12A:
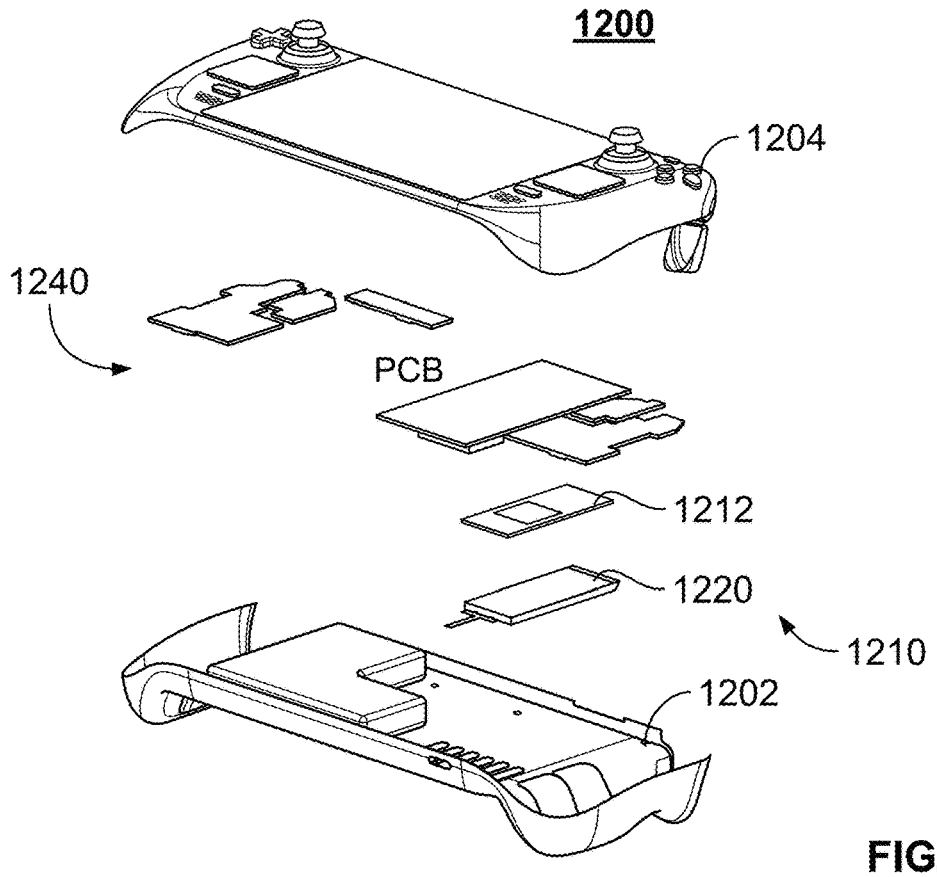
FIGS. 12A and 12B depict an embodiment of a gaming computing device incorporating a heat transfer structure including an active MEMS differential pressure device in an exploded view and in an air flow view.
Figure 12B:
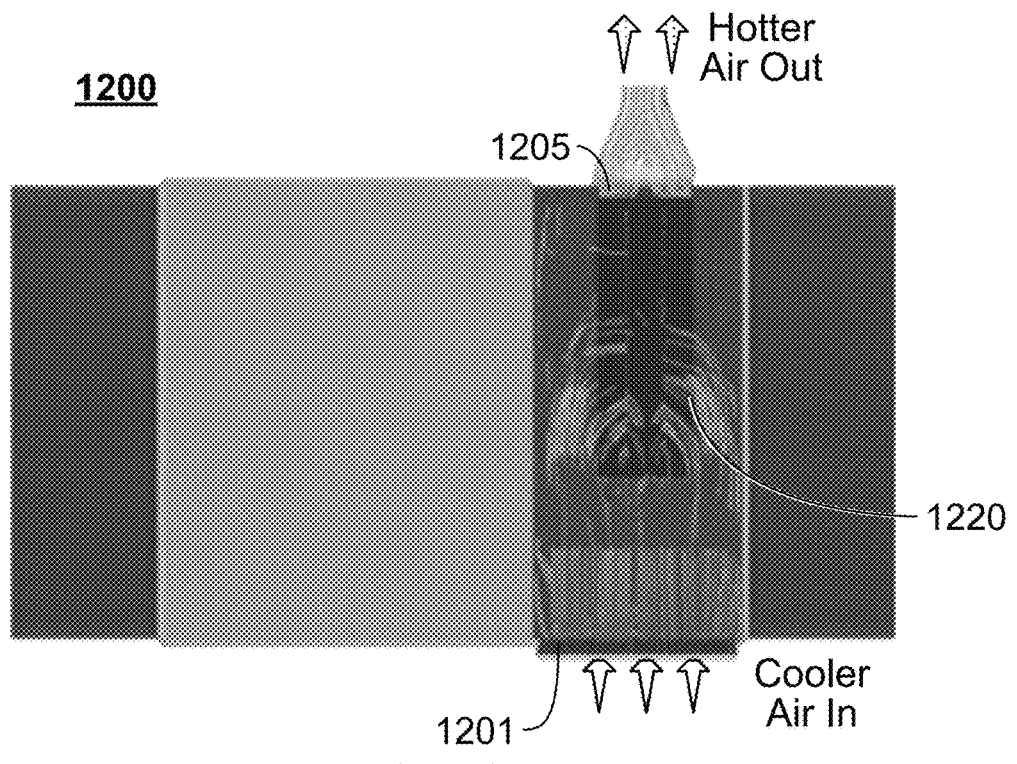

FIGS. 12A and 12B depict exploded and air flow views of an embodiment of computing device 1200 incorporating heat transfer structure 1210. Computing device 1200 is a hand-held gaming device. Computing device 1200 is a thin computing device having an interior height analogous to that described herein. Computing device 1200 is analogous to computing device(s) 500, 600, 900, 1000, and/or 1100. Computing device 1200 may include bottom cover 1202, top cover/display 1204, processor(s) (not explicitly labeled), PCB 1240, ingress 1201, and egress 1205 analogous to bottom cover 502/602/902/1002/1102, top cover 504/604/904/1004/1104, processor(s) 530/630/930/1130, circuit board(s) 540/640/940/1040/1140, ingress 501/601/901/1001/1101, and egress 505/605/905/1005/1105.

Heat transfer device 1210 includes heat spreader 1212 and active MEMS differential pressure device 1220 that are analogous to heat spreader 512/612/912/1012/1112 and differential pressure device 520/620/920/1020/1120. Heat spreader 1212 is thermally coupled to the processor(s), for example via thermal conduction. In some embodiments, heat spreader 1212 is a vapor chamber. Fluid is driven by differential pressure device 1220, which performs cooling in an analogous manner to differential pressure device(s) 520/620/920/1020/1120. In some embodiments, eight cooling dells may be present in some embodiments of differential pressure device 1220. The direction of fluid flow is shown in FIG. 12B by lighter lines. Thus, cool air is drawn into ingress 1201 proximate to PCB 1240, is drawn into differential pressure device 1220, and driven out via egress 1205.

Heat transfer device 1210 functions in an analogous manner to heat transfer device 510, 610, 910, 1010 and/or 1110. Gaming system 1200 may have improved performance analogous to that of computing device(s) 500, 600, 900, 1000, and/or 1100. Consequently, thermal management for and performance of gaming device 1200 may be improved.

Figure 13A:
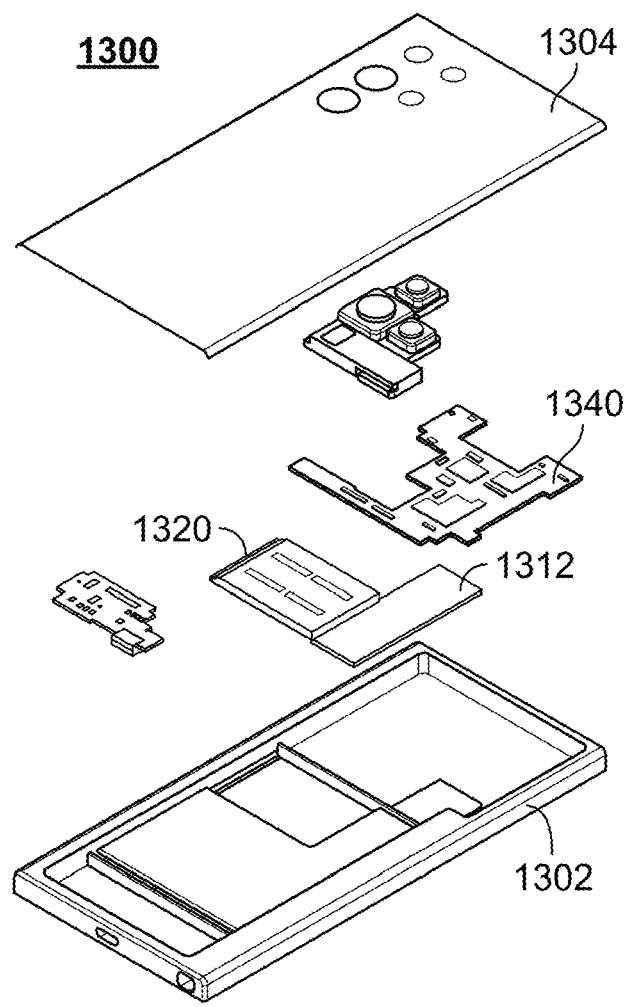
FIGS. 13A and 13B depict an embodiment of a smart phone incorporating a heat transfer structure including an active MEMS differential pressure device in an exploded view and in an air flow view.
Figure 13B:
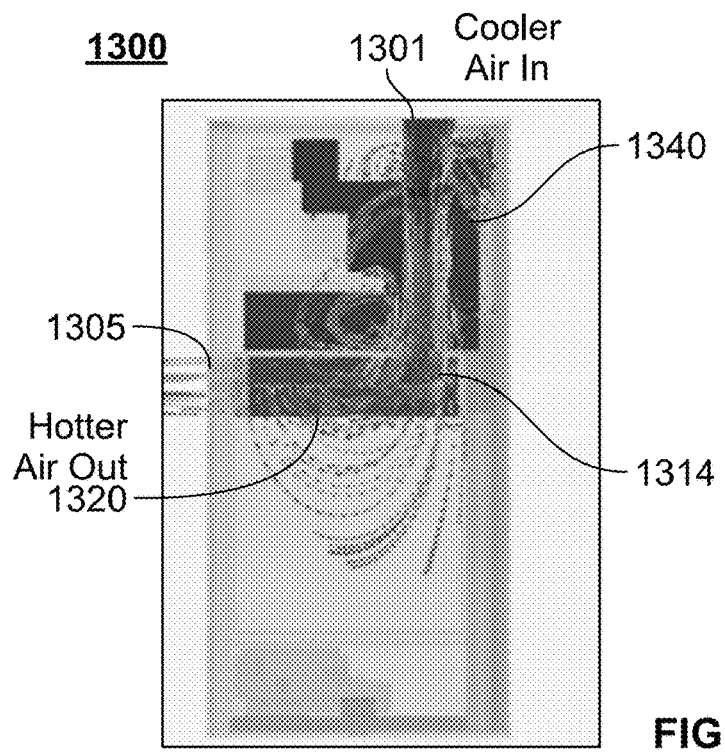

FIGS. 13A and 13B depict exploded and air flow views of an embodiment of computing device 1300 incorporating heat transfer structure 1310. Computing device 1300 is a smart phone. Computing device 1300 is, therefore, a thin computing device having an interior height analogous to that described herein. Computing device 1300 is analogous to computing device(s) 500, 600, 900, 1000, 1100, and/or 1200. Computing device 1300 may include bottom cover 1302, top cover/display 1304, processor(s) (not explicitly labeled), PCB 1340, ingress 1301, and egress 1305 analogous to bottom cover 502/602/902/1002/1102/1202, top cover 504/604/904/1004/1104/1204, processor(s) 530/630/930/1130, circuit board(s) 540/640/940/1040/1140/1240, ingress 501/601/901/1001/1101/1201, and egress 505/605/905/1005/1105/1205.

Heat transfer device 1310 includes heat spreader 1312 and active MEMS differential pressure device 1320 that are analogous to heat spreader 512/612/912/1012/1112 and differential pressure device 520/620/920/1020/1120. Heat spreader 1312 is thermally coupled to the processor(s), for example via thermal conduction. In some embodiments, heat spreader 1312 is a vapor chamber. Fluid is driven by differential pressure device 1320, which performs cooling in an analogous manner to differential pressure device(s) 520/620/920/1020/1120. In some embodiments, eight cooling dells may be present in some embodiments of differential pressure device 1320. The direction of fluid flow is shown in FIG. 13B by lighter lines. Thus, cool air is drawn into ingress 1301 proximate to PCB 1340, flows through smart phone 1300, is drawn into differential pressure device 1320, and driven out via egress 1305.

Heat transfer device 1310 functions in an analogous manner to heat transfer device 510, 610, 910, 1010, 1110, and/or 1210. Smart phone 1300 may have improved performance analogous to that of computing device(s) 500, 600, 900, 1000, 1100, and/or 1200. Consequently, thermal management for and performance of smart phone 1300 may be improved.

Thus, various embodiments of systems 100, 200, 300, 400, 500, 600, 700, 800, 900, 1000, 1100, 1200, and 1300 have been shown. Features of systems 100, 200, 300, 400, 500, 600, 700, 800, 900, 1000, 1100, 1200, and/or 1300 may be combined in manners not explicitly depicted herein.

Figure 14:
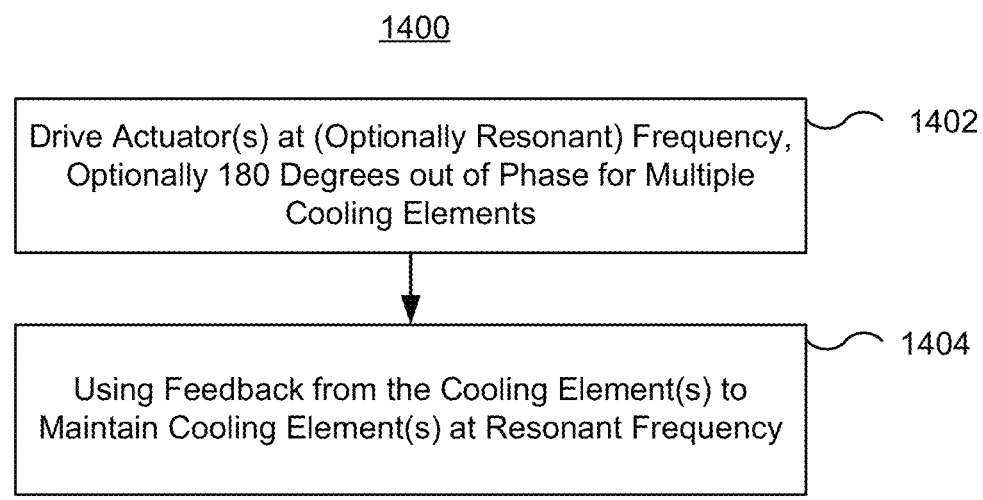
FIG. 14 depicts an embodiment of a method for using an active heat transfer structure.

FIG. 14 is a flow chart depicting an exemplary embodiment of method 1400 for operating a differential pressure device. Method 1400 may include steps that are not depicted for simplicity. Method 1400 is described in the context of differential pressure devices 100, 420 and/or 520. However, method 1400 may be used with other cooling systems including but not limited to systems and cells described herein.

One or more of the actuator(s) in a differential pressure device is actuated to vibrate, at 1402. At 1402, an electrical signal having the desired frequency is used to drive the actuator(s). In some embodiments, the actuators are driven at or near structural and/or acoustic resonant frequencies at 1402. The driving frequency may be 15 kHz or higher. In some embodiments, the driving signal may be 20 kHz or higher. If multiple actuators are driven at 1402, the cooling actuators may be driven out-of-phase. In some embodiments, the actuators are driven substantially at one hundred and eighty degrees out of phase. Further, in some embodiments, individual actuators are driven out-of-phase. For example, different portions of an actuator may be driven to vibrate in opposite directions (i.e. analogous to a seesaw). In some embodiments, individual actuators may be driven in-phase (i.e. analogous to a butterfly). In addition, the drive signal may be provided to the anchor(s), the actuator(s), or both the anchor(s) and the actuator(s). Further, the anchor may be driven to bend and/or translate.

Feedback from the piezoelectric actuator(s) is used to adjust the driving current, at 1404. In some embodiments, the adjustment is used to maintain the frequency at or near the acoustic and/or structural resonant frequency/frequencies of the actuator(s) and/or cooling system. Resonant frequency of a particular actuator may drift, for example due to changes in temperature. Adjustments made at 1404 allow the drift in resonant frequency to be accounted for.

For example, piezoelectric actuators within differential pressure devices 420 and/or 520 may be driven at or near their structural resonant frequency/frequencies, at 1402. Such actuators may correspond to cooling element 120. This resonant frequency may also be at or near the acoustic resonant frequency for the top chamber 140. This may be achieved by driving piezoelectric layer(s) in anchor 160 and/or piezoelectric layer(s) in actuator 120. At 1404, feedback is used to maintain actuators 120 at resonance and, in some embodiments in which multiple actuators are driven, one hundred and eighty degrees out of phase. Thus, the efficiency of actuator 120 in driving fluid flow through differential pressure device 420 and/or 520 may be maintained. In some embodiments, 1404 includes sampling the current through actuator 120 and/or the current through anchor 160 and adjusting the current to maintain resonance and low input power.

Consequently, differential pressure devices 420, 520, 620, 720, 820, 920, 1020, 1120, 1220, and/or 1320 may be operated to drive fluid through a thin computing device. Thus, thin computing devices may be more efficiently cooled. Thermal management and performance of such thin computing devices may be enhanced.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A cooling system in a computing device, comprising:
a heat transfer structure including:
   a heat spreader;
   a fin structure that transfers heat from the heat spreader to a fluid; and
   a differential pressure device that generates a low pressure region that draws the fluid from an ingress in the computing device through the fin structure, from the fin structure to at least one vent of the differential pressure device, and out at least one orifice of the differential pressure device;
   wherein the heat transfer structure is enclosed in a chamber of the computing device, the chamber having the ingress and an egress, the fin structure residing in a fluid path between the ingress and the differential pressure device.

2. The cooling system of claim 1, wherein the heat transfer structure restricts flow driven by the differential pressure device such that a pressure differential of at least a 0.0145 pounds per square inch per cubic feet per minute (cfm) (0.0145 psi/cfm) is within the chamber.

3. The cooling system of claim 2, wherein the pressure differential is at least 0.058 psi per cfm (0.058 psi/cfm).

4. The cooling system of claim 3, wherein the pressure differential is at least 0.0725 psi per cfm (0.0725 psi/cfm).

5. The cooling system of claim 1, wherein the differential pressure device generates the low pressure region that draws fluid from the ingress such that the heat transfer structure is capable of transferring greater than 2 W of heat from the fin structure to the fluid and ejecting the heat from the egress.

6. The cooling system of claim 5, wherein the differential pressure device generates the low pressure region such that the heat transfer structure is capable of transferring greater than 6 W of heat from the fin structure to the fluid and ejecting the heat from the egress of the computing device.

7. The cooling system of claim 1, wherein the differential pressure device further includes:
a plurality of cells, each of the plurality of cells including a flow chamber having a vent of the at least one vent, an actuator, and a plurality of orifices of the at least one orifice, vibrational motion of the actuator drawing the fluid into the flow chamber via the vent, directing the fluid around the actuator, and driving the fluid out of the flow chamber through the plurality of orifices;
a top cover proximate to the vent and having at least one aperture therein; and
a bottom plate proximate to the plurality of orifices and coupled with the top cover, the fluid being directed from the plurality of orifices toward the bottom plate.

8. The cooling system of claim 7, wherein the fluid flows through the differential pressure device and to the egress.

9. The cooling system of claim 7, wherein a top gap is between the top cover of the differential pressure device and a top of the chamber, the top gap being at least 0.5 mm and not more than 1 mm.

10. The cooling system of claim 7, wherein the differential pressure device has a height not exceeding 3.5 millimeters.

11. A cooling system in a computing device, comprising:
a heat transfer structure including:
   a heat spreader;
   a differential pressure device that generates a low pressure region that draws fluid from an ingress in the computing device through the heat transfer structure, the differential pressure device having a height not exceeding 3.5 millimeters; and
   a fin structure that transfers heat from the heat spreader to the fluid, the fin structure being in a fluid path between the ingress and the differential pressure device, the low pressure region generated by the differential pressure device drawing the fluid through the fin structure, from the fin structure to at least one vent of the differential pressure device, and out at least one orifice of the differential pressure device.

12. The cooling system of claim 11, wherein the height of the differential pressure device does not exceed 3 millimeters.

13. The cooling system of claim 12, wherein the heat transfer structure resides in a chamber of the computing device having a chamber height of at least 2 millimeters and not more than 3.5 millimeters.

14. The cooling system of claim 11, wherein the heat transfer structure is enclosed in a chamber of the computing device, the chamber having the ingress and an egress; and
wherein the differential pressure device is not thermally coupled to the heat spreader by thermal conduction.

15. The cooling system of claim 14, wherein the heat transfer structure restricts flow driven by the differential pressure device such that a pressure differential of at least a 0.0145 pounds per square inch (psi) per cubic feet per minute (cfm) (0.0145 psi/cfm) is within the chamber.

16. The cooling system of claim 11, wherein the differential pressure device generates the low pressure region such that the heat transfer structure is capable of transferring greater than 2 W of heat is from the fin structure to the fluid and ejecting the heat from an egress of the computing device.

17. The cooling system of claim 11, wherein the differential pressure device further includes:
a plurality of cells, each of the plurality of cells including a flow chamber having a vent of the at least one vent, an actuator, and a plurality of orifices of the at least one orifice, vibrational motion of the actuator drawing the fluid into the flow chamber via the vent, directing the fluid around the actuator, and driving the fluid out of the flow chamber through the plurality of orifices;
a top cover proximate to the vent and having at least one aperture therein; and
a bottom plate proximate to the plurality of orifices and coupled with the top cover, the fluid being directed from the plurality of orifices toward the bottom plate.

18. A method, comprising:
activating an active component in a differential pressure device to undergo vibrational motion, a computing device including a heat transfer structure, the heat transfer structure including the differential pressure device, a fin structure, and a heat spreader, the fin structure transferring heat from the heat spreader to a fluid, the vibrational motion of the active component generating a low pressure region that draws the fluid from an ingress in the computing device through the fin structure, from the fin structure to at least one vent of the differential pressure device, and out at least one orifice of the differential pressure device, the heat transfer structure being enclosed in a chamber of the computing device, the chamber having the ingress and an egress, the fin structure residing in a fluid path between the ingress and the differential pressure device.

19. The method of claim 18, wherein the vibrational motion of the active component generates a low pressure region that draws fluid from an ingress in the computing device such that greater than 2 W of heat is ejected from the egress.

20. The method of claim 18, wherein the differential pressure device has a height not exceeding 3.5 millimeters.

21. The cooling system of claim 1, wherein the differential pressure device is not thermally coupled to the heat spreader by thermal conduction.

* * * * *